United States Patent [19]
Lin

[11] Patent Number: 5,954,828
[45] Date of Patent: *Sep. 21, 1999

[54] NON-VOLATILE MEMORY DEVICE FOR FAULT TOLERANT DATA

[75] Inventor: Tien-Ler Lin, Saratoga, Calif.

[73] Assignee: Macronix International Co., Ltd., Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 08/553,635

[22] PCT Filed: Jan. 5, 1995

[86] PCT No.: PCT/US95/00079

§ 371 Date: Dec. 5, 1995

§ 102(e) Date: Dec. 5, 1995

[87] PCT Pub. No.: WO96/21229

PCT Pub. Date: Jul. 11, 1996

[51] Int. Cl.$^6$ ........................................... G06F 12/00
[52] U.S. Cl. .......................... 714/630; 371/21.1; 365/201
[58] Field of Search .................. 395/182.06, 182.03, 395/182.05, 183.18, 185.07; 371/21.1, 21.6, 10.2, 40.4, 40.13, 40.18; 365/201, 218; 711/102, 114

[56] References Cited

U.S. PATENT DOCUMENTS

| | | |
|---|---|---|
| 3,814,922 | 6/1974 | Nibby et al. ............................. 371/21.6 |
| 4,414,665 | 11/1983 | Kimura et al. . |
| 4,456,995 | 6/1984 | Ryan . |
| 4,498,151 | 2/1985 | Henry ....................................... 711/103 |
| 4,527,251 | 7/1985 | Nibby, Jr. et al. .................. 395/182.06 |
| 4,736,373 | 4/1988 | Schmidt . |
| 4,958,352 | 9/1990 | Noguchi et al. . |
| 5,200,959 | 4/1993 | Gross et al. . |
| 5,297,148 | 3/1994 | Harari, et al. . |
| 5,317,573 | 5/1994 | Bula et al. . |
| 5,361,227 | 11/1994 | Tanaka ................................. 365/189.01 |
| 5,369,616 | 11/1994 | Wells et al. . |
| 5,416,782 | 5/1995 | Wells et al. . |
| 5,418,752 | 5/1995 | Harari et al. . |
| 5,438,573 | 8/1995 | Mangan et al. . |
| 5,666,480 | 9/1997 | Leung et al. ............................ 395/180 |

OTHER PUBLICATIONS

Intel, 28F016SA 16 MBIT (1 MBIT ×16, 2 MBIT ×8) Flashfile Memory, 3–6 –3–21, Oct. 1993.

Primary Examiner—Dieu-Minh T. Le
Attorney, Agent, or Firm—Haynes & Beffel LLP

[57] ABSTRACT

A non-volatile memory device based on an array of floating gate memory cells includes read, erase, program and verify control logic for the array. A status register is coupled with the control logic and stores statistics determined during verify operations concerning at least one of the erase and program operations. For instance, the control logic may include erase verify resources and program verify resources, and the statistics will indicate a number of memory cells which fail erase or program verify. Alternatively, the statistics may indicate whether a threshold number of sequential bytes in the memory fail program verify for a program or erase operation involving a page or sector of data. In addition, defective addresses can be stored. With the status register, the number of program and erase retries for the device can be significantly reduced, allowing application of the device to real time storage systems. Many real time storage problems are fault tolerant. That is, a number of errors in a large amount of data will not be significant. Thus, the user of the device can rely on the status register to indicate how many errors have been detected in the array. If more than a threshold number of errors is detected, then the data can be discarded. However, for fault tolerant applications, the device will store a significant amount of data with few errors which will not affect operation of the system.

76 Claims, 8 Drawing Sheets

NON-VOLATILE MEMORY DEVICE FOR FAULT TOLERANT DATA

BACKGROUND OF THE INVENTION

1. Field of the Invention

The present invention relates to non-volatile memory devices based on floating gate memory cells; and more particularly to flash EPROM or EEPROM integrated circuits adapted for storing fault tolerant data.

2. Description of Related Art

Non-volatile, integrated circuit memory devices based on floating gate transistors include devices known as electrically programmable read only memory EPROM, electrically erasable and programmable read only memory, EEPROM, and recently so-called flash memory. As the density of the floating gate devices has increased, making them more cost-effective, and as the programming and erasing speed has increased, this type of non-volatile memory has gained significant popularity. However, the process of programming data in a non-volatile memory device based on a floating gate, is still a relatively slow process. The process involves moving charge either into or out of the floating gate of the memory cell, in order to establish a data pattern in the array. Where the floating gate of a given cell is charged up with a population of electrons, the turn on threshold for the memory cell increases above the read gate voltage. Discharging the electrons from the floating gate moves the turn on threshold down below the read gate voltage. Thus, data may be written into the non-volatile memory array by processes which charge and discharge the floating gates.

The mechanisms for charging and discharging the floating gates in these devices include so-called hot electron injection, and so-called Fowler-Nordheim tunneling. Hot electron injection is used for increasing the charge in the floating gate by connecting the gate and the drain to a relatively high voltage, and the source to a relatively low voltage. Hot electrons in the resulting channel current are injected across the thin oxide which separates the floating gate from the channel. This results in an increase in charge in the floating gate. Alternatively, so-called Fowler-Nordheim tunneling can be used to program or erase the cell. The tunneling mechanism operates by establishing a large potential between the gate and the drain, source, or channel. The Fowler-Nordheim tunneling effect results in charge tunneling through the thin oxide which isolates the floating gate. The Fowler-Nordheim tunneling process is relatively slow compared to the hot electron injection process. However, hot electron injection utilizes higher current. Further, hot electron injection cannot be used for discharging the floating gate. Rather, the tunneling mechanism is most often used for the discharging process.

The tunneling and hot electron injection mechanisms used for programming and erasing cells in a floating gate device do not affect each cell in the array identically. Therefore, the programming and erasing functions on modern floating gate devices include erase and program verify algorithms. After a programming or erasing operation, the memory subject of the operation is verified. If any cell fails the verify process, then a re-program or re-erase process is executed. This process is re-tried a large number of times (as many as 1000 times or more in some devices) in order to ensure that all of the data in the array is accurately stored, and to prevent having to discard floating gate devices which would otherwise operate satisfactorily, except for the number of retries required to program or erase the cells.

The program and erase verify procedures involved in these devices are relatively time consuming. Therefore, the use of flash memory or other floating gate memory devices for real time storage applications has been limited. In a real time application, an incoming stream may supply more data than the flash memory device is capable of storing without being overrun. Therefore, real time applications in the past have relied on dynamic RAM, SRAM, or other reliable fast memory techniques. However, these prior art memory techniques are not non-volatile, and data can be lost if there is an interruption in power.

Prior art flash memory systems for sequential data such as described in U.S. Pat. No. 5,200,959, invented by Gross, et al., have mapped defects byte by byte in a floating gate array, and stored the defect map in the floating gate array itself. Using the defect map, future operations may avoid defective areas in the device, improving performance and device endurance (see column 8, line 62 to column 9, line 16 of Gross, et al.). This is useful for applications which are not time critical, and tolerate no errors. However, in time critical operations or operations in which there is insufficient buffer memory, the extra time involved in generating and storing defect maps makes the devices impractical for fast sequential data streams.

Accordingly, it is desirable to provide a floating gate memory device architecture, such as high density flash memory, which is capable of storing a time critical data stream, and which is low cost and fault tolerant.

SUMMARY OF THE INVENTION

The present invention provides a non-volatile memory device based on an array of floating gate memory cells which tolerates defects in the array. The array includes read, erase, program and verify control logic for the array. A status register is coupled with the control logic and stores statistics determined during verify operation which characterize defects detected concerning at least one of the erase and program operations which involves a plurality of bytes of data. For instance, the control logic may include erase verify resources and program verify resources, and the statistics will indicate a number of defects, such as a number of bytes in the plurality including memory cells which fail erase or program verify. Alternatively, the statistics may indicate whether a threshold number of sequential bytes in the memory fail program verify and an address of a byte determined during verify to have a defect. With the status register, the number of program and erase retries for the device can be significantly reduced, allowing application of the device to real time storage systems.

Many real time storage problems are fault tolerant. That is, a number of errors in a large amount of data will not be significant. Thus, the user of the device can rely on the status register to indicate how many errors have been detected in the plurality of bytes subject of an operation. Only if more than a threshold number of errors for the operation is detected, will the data discarded or reprogrammed elsewhere in the array. For fault tolerant applications, the device will store a significant amount of data, while tolerating a few errors which will not substantially affect use of the data.

For instance, many audio applications store large amounts of digitized audio data. In these applications, an erroneous byte or two in a given audio data stream will not significantly affect the quality of any audio output based on that data. However, it is important to know how many errors are in the data, and whether certain classifications of errors might occur, such as a number of sequential errors. If too many errors or the wrong kind of errors are detected in the data, then the faulty segment of the memory array can be identified as a bad sector, and not used again. Alternatively, a defect map for the faulty segment can be generated for use in later operations.

Thus, the invention can be characterized as a process for storing a sequence of bytes of data in an array of floating gate memory cells. This process comprises programming a segment of data into the array; executing a verify operation for this segment; and determining during the verify operations statistics concerning defects in the programmed segment. These statistics are stored in a memory which is read after the program operation. These statistics may include a number of defects for the operation, and the process according to this aspect includes the step of reprogramming data to another area of the array if the statistics indicate that more than the threshold number of defects is found for the segment, or alternatively discarding the data from the defective segment.

The statistics may be stored in a status register which includes a first field for storing information concerning memory configuration or other information, including a bit indicating whether a defect was detected in a preceding program or erase verify operation. The second field in the status register stores a count of defects detected during the preceding operation. According to this aspect, the process of reading the statistics involves first reading the first field to determine whether a defect was detected. If the first field indicates that a defect was detected, then the second field is read to determine whether the threshold has been exceeded. Furthermore, the address or addresses of defective bytes may be stored in the status registers, and used for optimizing device performance on the fly.

According to another aspect of the invention, the memory may be segmented into a first section storing data which is not fault tolerant, and a second section for storing data which is fault tolerant. For instance, the first section may store header information about segments of sequential data, where the header information is relied on for processing which must be accurate. The non-fault tolerant first section may be modified to improve its reliability such as providing plural memory cells per bit. Alternatively, the control logic may include circuitry which retries program operations for cells which fail program verify for a retry count which may be greater for the first section than it is for the fault tolerant second section. If any cell in the first section fails, then the then the section is bad. If a cell fails in the second section, then the failure is analyzed and statistics about that failure are stored in the status register for the host system to analyze, and the device continues operating normally.

The invention can also be characterized as a non-volatile memory device for fault tolerant data storage which includes an array of floating gate memory cells as above. In this aspect, an input buffer is provided which receives the real time input data stream. A page program buffer is coupled to the input buffer, and receives data from the input buffer and applies received page data to the array for programming. Program control logic is coupled to the input buffer and the program buffer, includes resources for programming the array with data from the page program buffer in parallel. The status register is coupled with the control logic and stores statistics concerning the program operations as discussed above.

In typical floating gate architectures, often a given sector of the array will have one or two "slow" bytes which limit the speed of the device to that of the slowest cell. According to the present invention, the "slow" bytes appear as statistics in the status register, but do not cause worst case programming speed for the device. This greatly improves usefulness of the device for time critical, fault tolerant applications.

Accordingly, a non-volatile memory device for real time fault tolerant applications has been provided. The device is particularly suited to storing audio or video data in low cost recording applications which are capable of tolerating a significant number of erroneous bytes of data without significantly affecting the quality of the recording. Many other real time data gathering applications are also fault tolerant, making the present invention a significant advancement for use of non-volatile integrated circuit memory devices.

Other aspects and advantages of the present invention can be seen upon review of the drawings, the detailed description, and the claims which follow.

DETAILED DESCRIPTION

Figure 1:
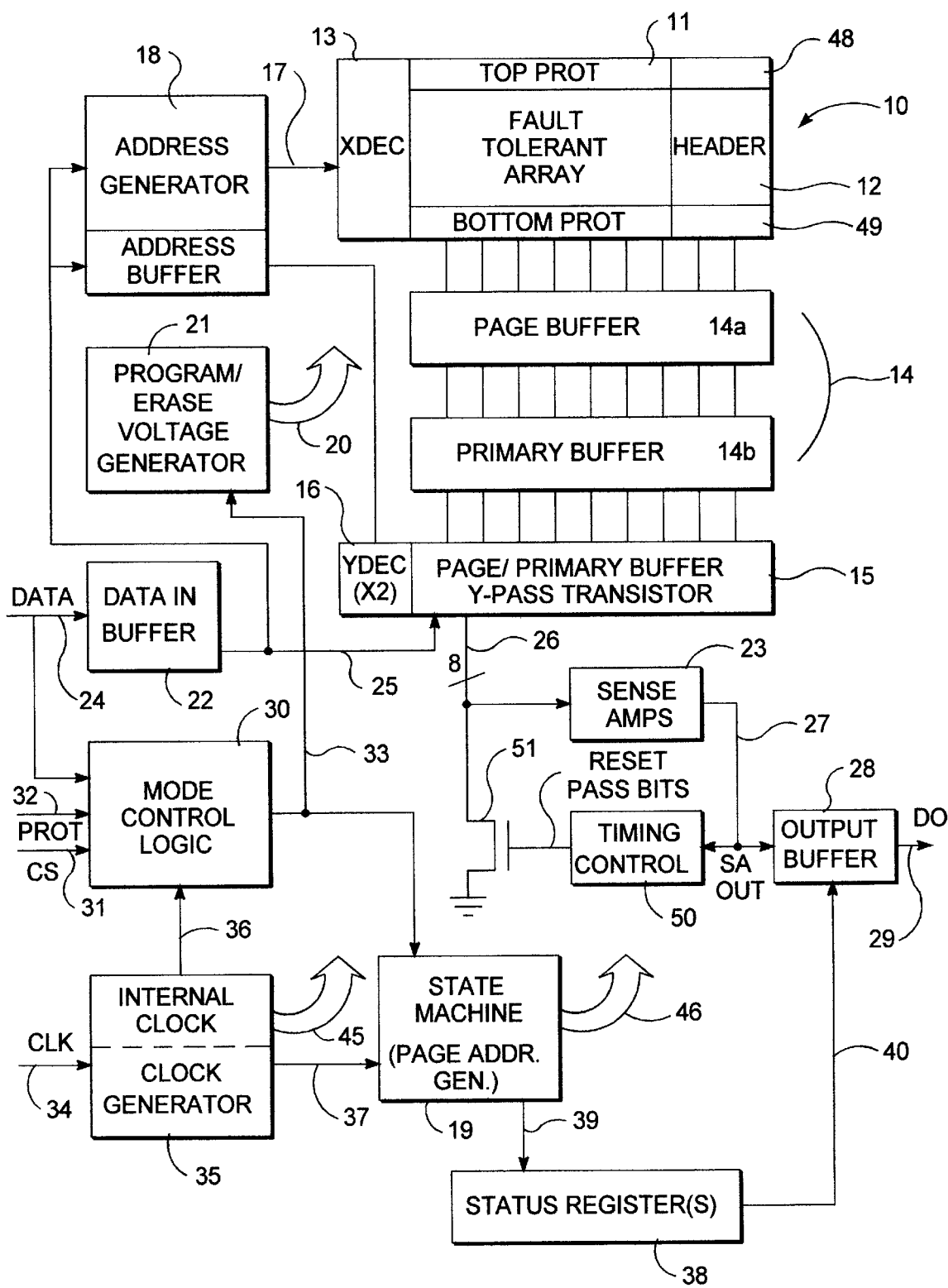
FIG. 1 is a schematic block diagram of an integrated circuit non-volatile memory device for fault tolerant data storage.

A detailed description of the present invention is provided with respect to FIGS. 1–4, in which FIG. 1 provides an integrated circuit architecture according to the present invention. Thus, as can be seen in FIG. 1, a non-volatile integrated circuit memory according to the present invention includes an EEPROM array, generally 10. The array 10 includes a fault tolerant section, generally 11, and a header section, generally 12. Of course, the layout of the header section and the fault tolerant section may be adapted to any particular implementation of the EEPROM array. Coupled with the array 10 is a row decoder (XDEC) 13, and a two stage program buffer 14. The program buffer 14 includes a page buffer 14a and a primary buffer 14b. The page buffer 14a and the primary buffer 14b are coupled to independent sets of y-pass transistors 15, which are in turn controlled by separate column decoders (YDEC) 16. The row decoder 13 and the column decoders 16 receive addresses across lines 17R and 17C from an address buffer/generator 18. The address buffer/generator 18 is connected to the data-in buffer 22 for receiving addresses from outside the chip for random access modes and for start addresses, and addresses are generated internally under control of the state machine 19, including a page address generator, which is coupled to the column decoders 16 across a line not shown. A program and erase voltage generator 21 is coupled as indicated generally by arrow 20 to the array for applying the high programming and erase potentials utilized for programming and erasing floating gate cells in the array 10 as known in the art. These voltages may drive the word lines, bit lines, and ground terminals of the array with programming potentials for hot electron injection and/or Fowler-Nordheim tunneling in the EEPROM array.

The y-pass transistors 15 for the primary buffer are coupled to the data-in buffer 22, and y-pass transistors for the page buffer and the array are coupled to a set of sense amplifiers 23. The data-in buffer 22 supplies data in response to the column decoder 16 into the primary buffer 14b. It receives input data on line 24 from external to the chip. According to one aspect, the data line 24 is connected to a single pin, and receives serial data into the data-in buffer 22. The data-in buffer 22 supplies a byte of data in parallel across line 25 to the y-pass transistors 15, which is utilized in response to addresses on line 17 to load the primary buffer 14b with input data. According to this example, the primary buffer 14b and the page buffer 14a store, for example, 132 bytes of data for programming in parallel into the array 10 (128 bytes in array 11 and 4 bytes in header 12).

The column decoder 16 is also operative during the read operations to connect 8 bit lines through the page buffer 14a as described below across line 26 to the set of sense amplifiers 23. The output of the sense amplifiers 23 is applied on line 27 to an output buffer 28. The output buffer 28 may include a parallel to serial translation, for supplying a serial output stream on line 29. Alternatively, the output stream on line 29 may be an 8 or 16 bit wide output bus.

In addition, the chip includes mode control logic 30 which is coupled to the data-in line 24, to a chip select input line 31, and to a protection signal input line 32. The mode control logic 30 is connected across line 33 to the state machine 19. A clock input 34 is connected to a clock generator 35. The clock generator 35 is coupled to the mode control logic on line 36 and the state machine 19 on line 37, and is used to clock the input and output data stream, and generate internal clocks for the state machine 19 and mode control logic 30. Also, as indicated generally by arrow 45, the clock generator 35 is coupled to a variety of blocks in the device.

The state machine 19 includes resources for controlling the reading, programming, erasing and verifying of the array 10. As indicated by the arrow 46, the state machine controls logic functions distributed throughout the device as known in the art. The state machine 19 includes verify logic, such as described below with reference to FIGS. 3 and 4 for the erase and program operations.

According to the implementation shown in FIG. 1, the architecture provides for page programming, where a page of 132 bytes is programmed in parallel. Basically, the operation includes a sector erase with erase verify, before programming, then page programming operations are extended. In addition, automatic program verify retry operations are executed using the timing control circuit 50, and the pass transistor 51 which are used to reset bits in the page buffer which pass during verify operations. When all bits in the page buffer have been reset, then a successful program has been completed. If the maximum retry count is exceeded, before all bits are reset, then a defect is logged to the status register as described in more detail below.

Also according to the present invention, the integrated circuit includes a status register or registers 38 implemented using flip-flops, static RAM cells, or other storage technology, usually volatile in nature and apart from the array. These registers are coupled to the state machine 19 on line 39 and store data about the programming and erasing operations executed in the array. The status register 38 is coupled on line 40 to the output buffer 28, and can be read by users of the device.

The mode control logic 30 implements a command definition based on the serial data input line 24, where the array 10 includes a sector erase architecture, and each sector includes a plurality of pages. For instance, each sector may include 132×8 bytes, and each page 132 bytes, for 8 pages per sector in the array.

The protect signal on line 32 is used to disable or enable both the program and erase operations in either top or bottom sections of the array. This is implemented by providing two non-volatile memory bits which are connected to the top and bottom sections of the array to indicate the protection status of each. When the PROT input on line 32 is asserted high during a chip select $\overline{CS}$ high to low transition, a subsequent input command will be examined for protection/unprotection command of the specified section. During the execution of the protection/unprotection mode, the non-volatile memory bit associated with the selected top or bottom section (48, 49 respectively) will be programmed or erased.

After a program or erase command is issued, an auto program or erase algorithm which includes a verification routine for the specified sector or page location is executed. These routines are described below with respect to FIGS. 3 and 4. The program command is executed on a page of 132 bytes, and the erase command is executed on a sector of 1,056 bytes. Suspend and program or erase abort commands are added to allow interruption during self-timed high voltage operations. Also, an erase resume command is provided to allow for resumption of erasing after the suspend operation.

The status registers 38 are included to indicate status and configuration of the chip. The status register commands can be issued to determine the completion and the error flag status of a program and/or erase operation, the error suspend status, the abort bit status, the detailed error report, and the status of the top and bottom protection flags.

The following tables provide a command definition for one implementation of the device, where SA2 is a second sector address byte; SA1 is a first sector address byte; PN is a page number in the sector; PA is a page address; X is don't care; and data is expressed in hexadecimal base. The PROT input and a sequence of data (1st to 7th bytes) specify a command.

For instance, the 2 byte sector address is decoded in the row decoder 13 to specify an 8 page sector. The page number is a 3-bit value decoded in the row decoder to specify a page with a sector. The page address indicates a byte within a page, and is decoded in the column decoder 16. Of course other sector sizes and decoding schemes could be used.

| COMMAND DEFINITION | | | | |
|---|---|---|---|---|
| Command | Read Array 1 | Read Array 2 | Array to Buffer | Read Buffer |
| PROT input | Low | Low | Low | Low |
| 1st byte | 01 | 02 | 03 | 81 |
| 2nd byte | SA2 | SA2 | SA2 | X |
| 3rd byte | SA1 | SA1 | SA1 | X |
| 4th byte | PN | PN | PN | PN |
| 5th byte | PA | PA | PA | PA |
| 6th byte | X | X | X | X |
| 7th byte | X | X | X | X |
| Action | One byte read out | n bytes read out until/CS↑ | n bytes transfer unit CS/↑ | n bytes transfer unit CS/↑ |

| Command | Write Buffer | Status Read 1 | Status Read 2 | Clear Status |
|---|---|---|---|---|
| PROT input | Low | Low | Low | Low |
| 1st byte | 82 | 83 | 84 | 85 |
| 2nd byte | X | AA | AA | AA |
| 3rd byte | X | 55 | 55 | 55 |
| 4th byte | PN | | | |
| 5th byte | PA | | | |
| 6th byte | X | | | |
| 7th byte | X | | | |
| Action | n bytes transfer until $\overline{CS}$↑ | Output 1st byte status | Output 2nd byte status | Clear status byte |

| Command | Sector Erase | Program | Erase Suspend | Erase Resume | Abort |
|---|---|---|---|---|---|
| PROT input | Low | Low | Low | Low | Low |
| 1st byte | F1 | F2 | F3 | F4 | F7 |
| 2nd byte | AA | AA | AA | AA | AA |
| 3rd byte | 55 | 55 | 55 | 55 | 55 |
| 4th byte | SA1 | SA2 | | | |
| 5th byte | SA1 | SA1 | | | |
| 6th byte | X | PN | | | |
| 7th byte | X | PA | | | |
| Action | Start to erase at $\overline{CS}$↑ | Load n bytes data to buffer until $\overline{CS}$↑ & start to program | Erase suspend mode<br><br>Suspend flag enabled | Resume erase<br><br>Clear erase suspend flag | Program erase aborted<br><br>Abort bit enabled |

| Command | Prot | Unprot | Sleep | P-Bit Erase | P-Bit Program |
|---|---|---|---|---|---|
| PROT input | High | High | Low | High | High |
| 1st byte | F5 | F6 | F8 | F9 | F4 |
| 2nd byte | 03-Bottom 00-Top | 03-Bottom 00-Top | AA | 00 | 00 |
| 3rd byte | AA | AA | 55 | AA | AA |
| 4th byte | 55 | 55 | | 55 | 55 |
| 5th byte | | | | | |
| 6th byte | | | | | |
| 7th byte | | | | | |
| Action | Auto program routine begins at $\overline{CS}$↑ | Auto erase routine begins at $\overline{CS}$↑ | Enter sleep mode<br><br>Sleep flag enabled | Auto erase routine begins at $\overline{CS}$↑ | Auto program routine begins at $\overline{CS}$↑ |

Thus, operation of the device according to the above command structure could be described as follows. Before any command is issued, according to the present invention the status register should be checked to ensure the device is ready for its intended operation.

1) Read Array 1

After the command is received, device will output one byte of array data from the specified address at the falling edge of clock input.

2) Read Array 2

Device will output the data of the array sequentially starting from the specified address at the falling edge of the clock input. And it will continuously output the data until $\overline{CS}$ goes high. If a read operation reaches the end of the page, it will wrap around to read the beginning of the page.

3) Memory Array to Buffer

Device will read the content of memory array and (a) output sequentially; (b) write the data sequentially to the corresponding primary buffer location, starting from the specified address, until $\overline{CS}$ goes high. The device will wrap around to write to the beginning of the primary buffer if it reaches the end of the page address.

4) Read Buffer

Device will output the data of the primary buffer starting from the specified page address at the falling edge of the clock input, until $\overline{CS}$ goes high. The device will wrap around to the beginning of the primary buffer if it reaches the end of the page address.

5) Write Buffer

Device will write the data from the input into the primary buffer sequentially starting from the specified page address at the rising edge of the clock, until $\overline{CS}$ goes high. While writing the buffer, the device will output the contents of the first status register to an output pin at each falling edge of the clock. If write transfer operation reaches the end of the primary buffer, it will wrap around to the beginning of the primary buffer.

6) Read Status Register 1

The status register read command can be issued at any time even when device is busy to determine the status of the device. The first status register is arranged as follows:

| | | |
|---|---|---|
| Bit 7 | = "1" | Device is ready |
| | = "0" | Device is busy doing program, erase, protection bit program or protection bit erase. |
| Bit 6 | = "1" | Top section is unprotected. |
| | = "0" | Top section is protected. |
| Bit 5 | = "1" | Bottom section is unprotected. |
| | = "0" | Bottom section is protected. |
| Bit 4 | = "1" | Device is in sleep mode. |
| | = "0" | Device is not in sleep mode. |
| Bit 3 | = "1" | Device was aborted in last high voltage operation. |
| | = "0" | Device was not aborted in last high voltage operation. |
| Bit 2 | = "1" | Device is in erase suspend state. |
| | = "0" | Device is not in erase suspend state. |
| Bit 1 | = "1" | An error in fault tolerant section occurred in last sector erase or page program operation. Second status register should be read to find out the number of failed locations in the selected page. |
| | = "0" | No error occurred in last page program. |
| Bit 0 | = "1" | An error in header file has occurred in last sector erase or page program operation. |
| | = "0" | No error in header section occurred in last sector erase or page program. |

7) Read Status Register 2

The second status register is arranged as follows:

| | | |
|---|---|---|
| Bit 7 | = "1" | Serial data is output at the falling edge of the clock. |
| | = "0" | Serial data is output at the rising edge of the clock. |

Bit 6 to bit 0 define the number of failed bytes during the last program/erase operation. After a high voltage operation, a user should first read the first status register to determine whether the device is ready and if any error occurred. If an error occurred, then the user should read the second status register to determine the number of failed locations. The maximum error count is 128 bytes for either page program or sector erase.

8) Clear Status Register

For first status register, this command can only reset defect detected bits (bit 1 and bit 0), and abort bit (bit 3). These three bits are set by on-chip state machine during operation, and can only be reset by issuing a clear status register command (or by powering down $V_{cc}$). For all other bits of the first status registers, R/B bit (bit 7) will be automatically reset when device completes program/erase operation, top and bottom protection bits (bit 6 and bit 5) are reset to "1" when corresponding protection non-volatile bit is erased, sleep bit (bit 4) is automatically reset when device gets out of sleep mode, and erase suspend bit (bit 2) is reset when erase resume command is issued.

For second status register, after clear command is issued, error counter (bit 6 to bit 0) will be reset to "0". The state of output polarity bit (7) depends on the status of output polarity non-volatile bit.

9) Sector Erase

The erase high voltage operation begins at the rising edge of $\overline{CS}$ and the device enters busy state. The self-timed operation will automatically verify the data until it is all erased or timeout occurs. After detection of ready signal, user should check erase defect detected bits (bit 1 and bit 0) to ensure no error occurred during erase.

10) Program

After program data is loaded into the primary buffer, the program high voltage operation will begin at the rising edge of $\overline{CS}$, and the device enters busy state and is ready for status read in less than 10 $\mu$s. At the beginning of the programming operation, the primary buffer transfers the data to the page buffer, so the primary buffer will be available to accept new data from input, while device is programming. The self-timed operation will automatically verify the data until it matches the page buffer or timeout occurs. After detection of ready signal, user should check defect detected bits (bit 1 and bit 0) to ensure no error occurred during program.

11) Erase Suspend

Device will respond to this command only when it is in erase state. After command is issued it takes a worst case of 0.5 milliseconds before the device enters erase suspend state and R/B bit (bit 7) goes high. User should read status register 1 to check device status before issuing another command. In erase suspend state, device will respond to all commands except sleep, sector erase, page program, erase suspend, protection, and unprotection and polarity write modes.

12) Erase Resume

After command is issued, device will clear erase suspend bit (bit 2), enter busy state and reactivate erase operation until its completion.

13) Abort

After abort command is issued, device will set abort bit (bit 3), and enter sleep mode. Since the data in the secondary page buffer and array data is no longer valid due to incomplete program or erase operation, the error bit (bit 1 and/or bit 0), will be set. In abort state, the device count is reduced to the same level as in sleep mode, sleep bit (bit 4) is set and R/B bit (bit 7) is in ready state. Since abort and error bits are set, clear status register command is required before a program or an erase command can be issued.

14) PROT Mode

After PROT command is issued, the automatic program operation begins at the rising edge of $\overline{CS}$. The device will automatically program and verify the non-volatile bit specified by the address input until it passes. At the completion, it will reset status bit to ready state and change corresponding protect bit (bit 5 or bit 6) to protection state, in which the data can be read only.

15) UNPROT Mode

After UNPROT command is issued, the automatic erase operation begins at the rising edge of $\overline{CS}$. The device will automatically erase and verify the non-volatile bit specified by the address input until it passes. At the completion, it will reset status bit to ready state and change corresponding bit (bit 5 or bit 6) to unprotection state. The device is in UNPROT state when it is shipped from the factory.

16) Sleep Mode

The sleep command allows the device to complete the current operation before going to sleep mode. Once the current operation is done, R/B bit (bit 7) returns to ready state, and sleep bit is set. Since status registers are not reset during sleep mode, error bits (bit 0 and bit 1) may have been set in last operation. Writing any other command will wake up the device out of the sleep mode, typical sleep current is less than 1 µA.

17) Output Polarity Erase

After this command is issued, the non-volatile bit which defines the clock polarity of serial data output will be erased, and serial output data will be shifted out at the falling edge of the clock during read. The state of the polarity bit can be read out at the bit "7" of second status register.

The status registers may be further adapted to include more information about a number of sequential bytes which fail programming and/or erasing. Some applications may be tolerant of errors which are distributed in the data, but not to errors which occur sequentially. Thus, a status flag can be added to the status register which indicates a pre-determined number of sequential errors.

The status registers can also be expanded to include information about each sector of the array, or each segment of the array. Thus, as described below, the array may be divided into header section 12, and a fault tolerant section 11. The statistics register may store information about the valid segments of the header section, and information about the number of errors in the fault tolerant section 11. Analysis of detected errors during the verify routines can be quite sophisticated using the state machine 19 to classify errors, locate errors, and the like.

The status registers may take on a variety of architectures. For instance, as shown here, two status registers may be used which require a two step reading process, involving reading the first register to determine whether bit 0 or bit 1 has been set to indicate an error in an erase or program operation. The second step involves reading the second register to determine the number of errors. In an alternative system, the first register may be deleted, involving only reading the second register. If any errors are detected, then a number is found in the register. No two step operation is needed.

Furthermore, the register may be expanded such that the levels of defect information are found in fields of a single addressable location. Thus, a single addressable location may include one field indicating the number of errors, and a second field indicating the location of the first error.

The header section 12 may be a segment in which no errors are tolerated. Thus, the program verify logic may execute more retries for the header section than for the fault tolerant section or other modification may be made to the header section 12. For instance, more than one cell per bit may be used, and a majority rule or a rule recognizing defect tendencies applied to control the data value when the cells for a single bit disagree, which makes the section 12 more reliable. The header section may store data about corresponding segments in the fault tolerant section, such as the number of errors in the segment, the location of the errors, a sequence number for the segment vis-à-vis other segments in the array, other information which is utilized by data processing algorithms, but should not contain errors. For instance, the header section 12 may be implemented as the first 4 bytes of a 132 byte page.

Figure 2:
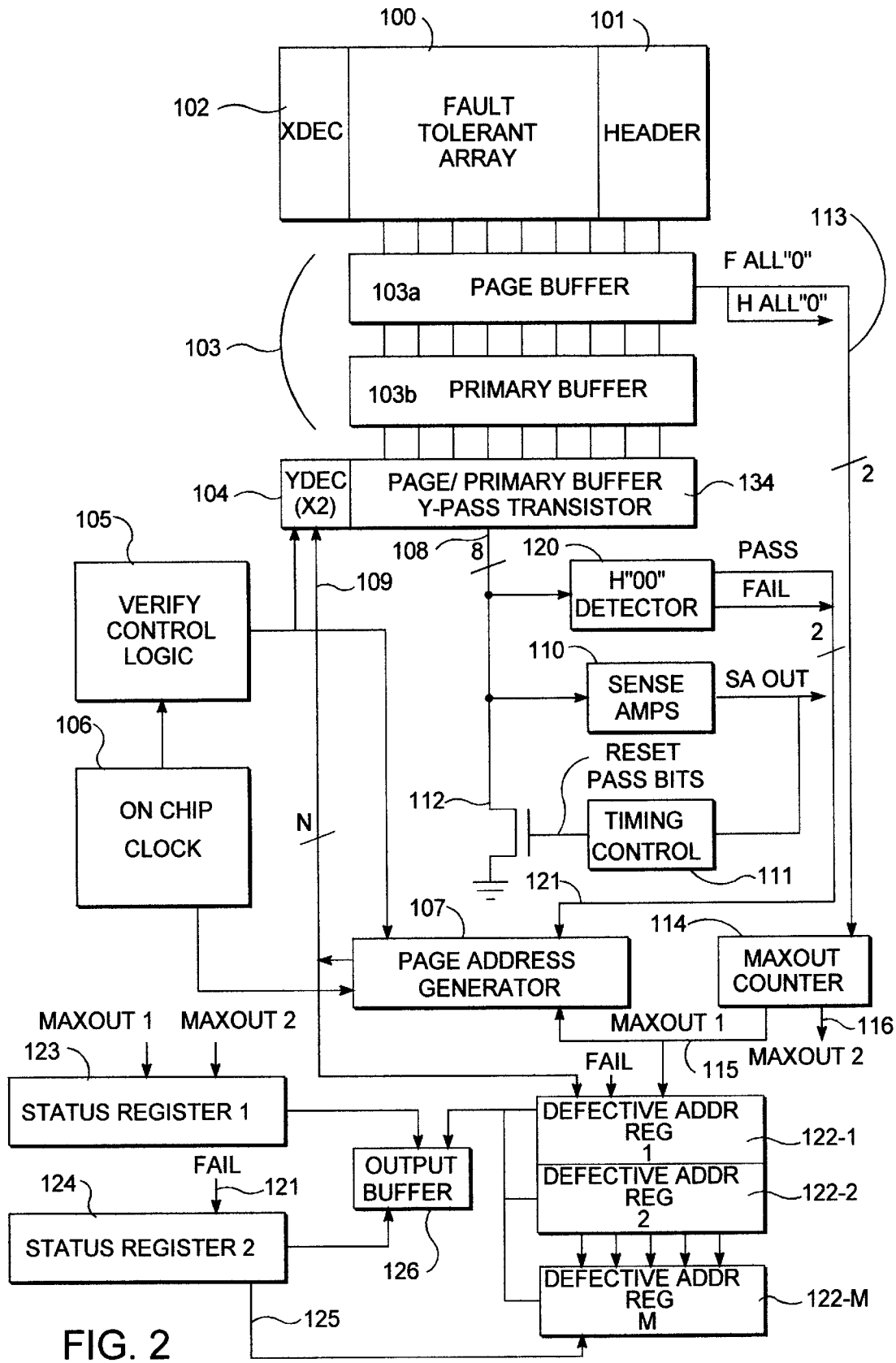
FIG. 2 is a schematic block diagram for an alternative architecture of an integrated circuit memory device according to the present invention.

FIG. 2 illustrates an alternative architecture according to the present invention which includes additional status registers, and provides for storing addresses of defective bytes in the array. Thus, the system of FIG. 2 includes a fault tolerant array, generally 100, including a header section 101. A row decoder 102 is coupled to the array. Also a program buffer 103 which includes a page buffer 103a and a primary buffer 103b as described above with reference to FIG. 1 is included. Two sets of y-pass transistors 134 are coupled to the page buffer 103a and primary buffer 103b respectively, and to independent column decoders 104. The independent paths to the primary buffer 103b and the page buffer 103a allow data to be loaded into the primary buffer under control of user supplied addresses, and for the page buffer 103a to be accessed for verify and statistics analysis logic separately using an internal page address generator 107. The address logic, erase and program voltage generator, and other standard elements of the architecture are not shown in FIG. 2 for clarity. Basically the system includes verify control logic 105 which is coupled to an on chip clock 106. A page address generator 107 is included and used during the verify operations according to the present invention.

As described above with reference to FIG. 1, during a verify operation data is read out through the Y-pass transistors 134 across line 108 in response to a page address which is supplied across line 109 from the page address generator to the column decoder 104. The data is supplied out one 8 bit byte at a time to sense amplifiers 110. Sense amplifier output is supplied to a timing control system 111 which is used to reset the passed bits in the page buffer using the pull down transistor 112.

Thus, when the page buffer includes all zeros, then an output is supplied on lines 113 indicating that condition. According to the present invention the page buffer may be segmented into a fault tolerant array 100 and a header array 101. According to this aspect, the signal on line 113 includes a first bit F.ALL"0" and a second bit H.ALL"0" which indicate, respectively, whether there are all zeros in the fault tolerant segment, or all zeros in the header segment. These signals are connected to a maxout counter 114 which generates a first maxout signal on line 115 when the maxout counter exceeds a first maxout threshold before the F.ALL"0" signal from line 113 goes high. Maxout counter 114 generates a second maxout signal on line 116 if the second threshold is reached before the H.ALL"0" signal on line 113 goes high.

After the verify operation, when the first maxout signal on line 115 goes high, the page address generator (which may be part of the state machine) causes the page buffer to be read through the H"00" detector 120 which detects when an address byte reads hex 00. The output of the detector 120 includes a pass bit and a fail bit which are supplied on line 121 to the address generator. If the byte of the page passes, then the page address generator 107 increments to the next byte of the page. If a failure is detected, then the address from the page address generator 107 is loaded into one of the defective address registers 122-1 through 122-M as explained below. Then the page address generator increments to the next 8 bit byte of the page. After the page is finished, the user may read the status registers.

The status registers in the device include the status register 1 123 and status register 2 124 configured as described above with respect to FIG. 1. The first status register 123 thus receives the maxout 1 and maxout 2 signals from the maxout counter 114 to store bits 0 and 1 which indicate whether an error has occurred in the last page program operation of the fault tolerant array 100, and whether an error has occurred in the header section 101, during the last operation. If an error occurs in the fault tolerant array, then the failed bit from line 121 is used to increment the count in status register 2 124. Also, the count stored in status register 2 is used as an address across line 125 for selecting the defective address register 122-1 through 122-M for storage of the defective address from the page address generator.

All of the registers 122-1 through 122-M and 123 and 124 can be read by the host system through the data out buffer 126 which is shown in simplified form in this Figure. There may be an additional command set up in the command set described above for defective address readout. The data out buffer 126 may be shared with the sense amps 10 or may be provided independently of the sense amps.

Figure 3:
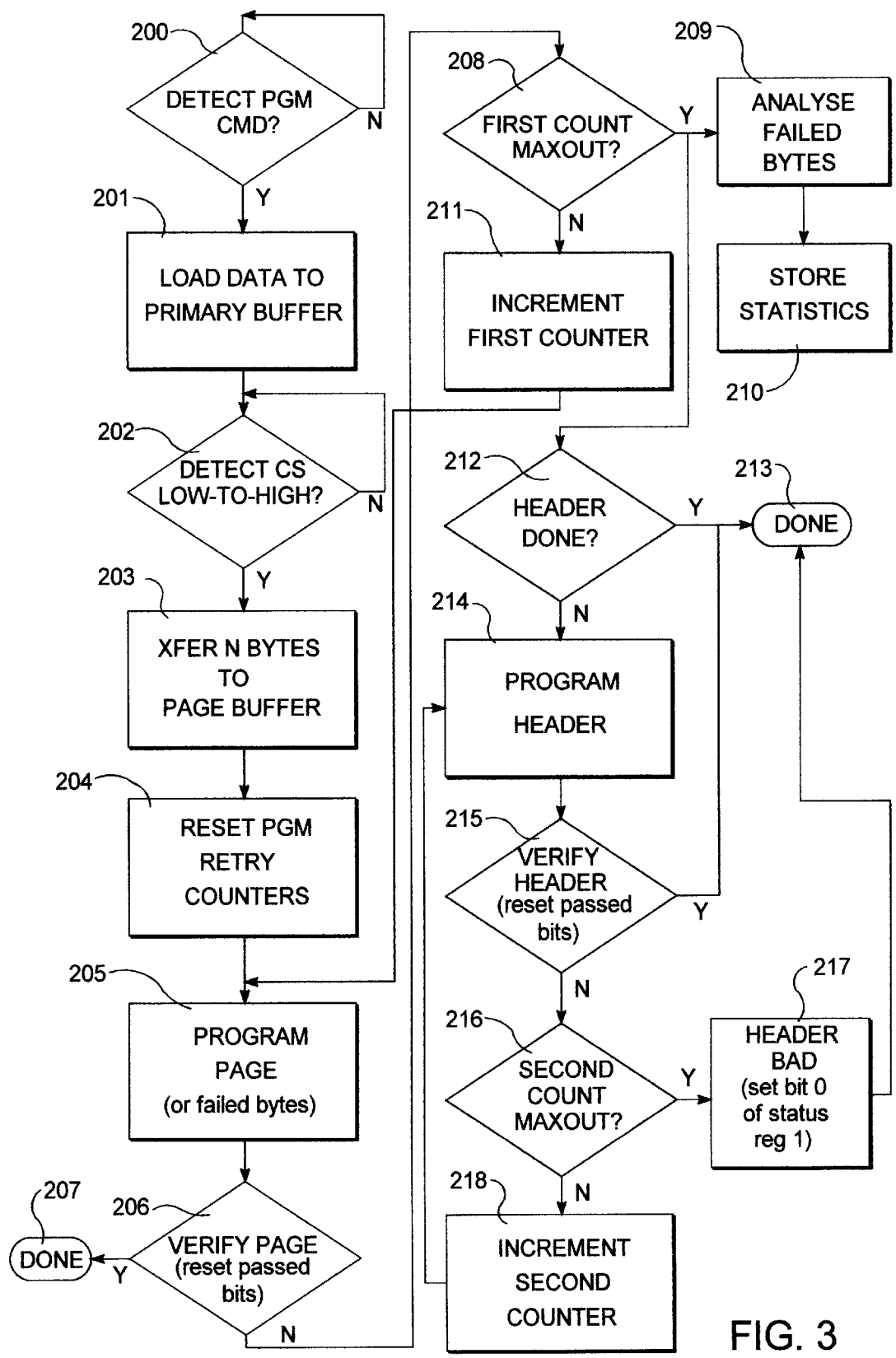
FIG. 3 is a flow chart for the program and program verify operation according to the present invention.
Figure 4:
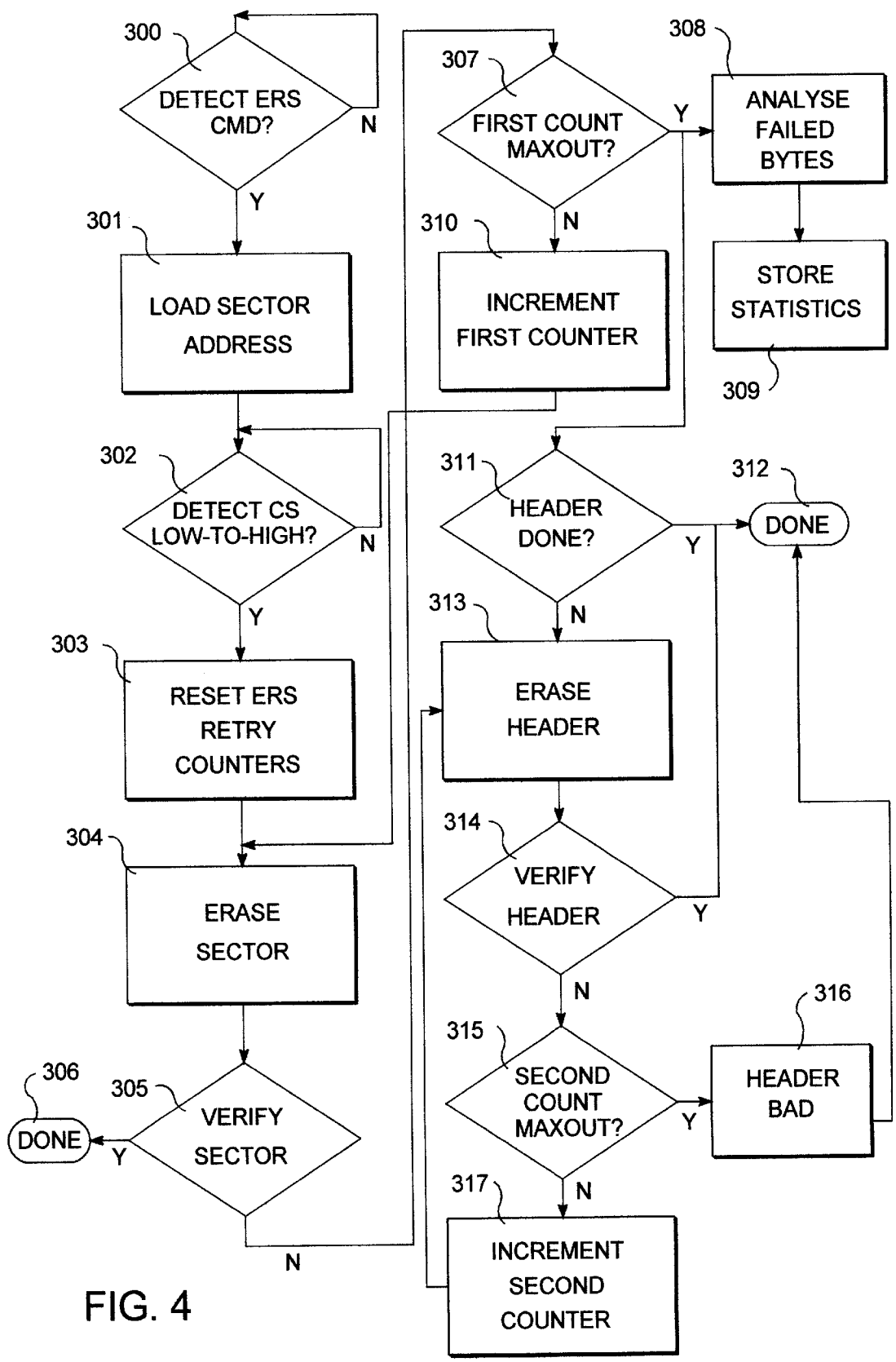
FIG. 4 is flow chart of the erase and erase verify operation according to the present invention.

FIGS. 3 and 4 illustrate the program and erase algorithms for use with the system of FIGS. 1 or 2. Thus, the algorithm of FIG. 3 begins by waiting for detection of the program command (block 200). If the command is detected, then data is loaded to the primary buffer (block 201). The algorithm then waits with data in the primary buffer until the chip select signal goes from low to high (block 202). Upon detection of the transition in the chip select signal, n bytes of data are transferred to the page buffer (block 203). Then the program retry counters are reset (block 204). From block 204, the program operation is executed for the data in the page buffer (block 205). This will include data from the original page, or data in the failed bytes only for subsequent passes through the loop. After programming the page, the verify operation is executed, resetting the passed bits (block 206). If the page verifies, then the algorithm is done (block 207). If the page does not verify, then the algorithm determines whether the first count has maxed out (block 208). If it has, then the failed bytes are analyzed (block 209) and the statistics are stored in the status registers (block 210). If the count is not exceeded, then the first retry counter is incremented (block 211) and the algorithm loops back to block 205 to retry the program.

When the first maxout count is exceeded, the statistics about the fault tolerant segment of the array are stored as mentioned above with respect to blocks 209 and 210, and the algorithm tests next whether the header passes verify (block 212). If it has, then the algorithm is done (block 213). If it has not, then the programming of the header is retried (block 214). This may involve resetting all bits in the page buffer which did not successfully program and which applied to the fault tolerant segment of the array. Then only failed bits in the header are retried. Next, the algorithm determines whether the header passes verify (block 215). If it does, then the algorithm is done and branches to block 213. If it does not pass verify, then the second retry count is tested (block 216). If the second count is exceeded, then the header is bad and bit 0 of the first status register is set (block 217). If it has not reached the maxout retry count, then the second counter is incremented (block 218) and the algorithm loops back to retry programming of the header at block 214.

FIG. 4 illustrates a flow chart for the erase operation according to the present invention. This algorithm begins by waiting for an erase command (block 300). Upon detection of the erase command, a sector address to be erased is loaded (block 301). After loading the sector address, the algorithm waits for a transition of the chip select signal (block 302). Upon transition, the erase retry counters are reset (block 303). Then, the sector is erased (block 304). Next, a verify operation for the sector is executed (block 305). If the verify passes, then the erase operation is done (block 306). If verify does not pass, then the first retry count is tested (block 307).

If the first retry count is exceeded, then the failed bytes are analyzed (block 308) and the statistics concerning the sector erase are stored (block 309). If the first count is not exceeded, then the retry counter is incremented (block 310), and the algorithm loops back to block 304 to retry erasing the sector.

Also, if the first retry count is maxed out at block 307, optionally if the header region is separable from to the fault tolerant region for erase, the algorithm checks whether the header section was successfully erased (block 311). If it was, then the algorithm is done (block 312). If it was not, then the header is again erased (block 313). A verify operation for the header region is then executed (block 314). If it passes, then the algorithm is done. If not, the second retry count is tested (block 315). If the second count has maxed out, then the header is bad (block 316), and bit 0 of the status register one is set to so indicate. If the second retry count has not been exceeded, then the counter is incremented (block 317) and the algorithm loops back to retry erasing the header at block 313.

FIG. 4 provides a generalized flow chart for the erase algorithm according to the present invention. One embodiment of the present invention might be implemented with an erase and erase verify process (or modified version thereof) as described in our co-pending U.S. patent application entitled FLASH EPROM WITH BLOCK ERASE FLAGS FOR OVER ERASE PROTECTION, U.S. patent application Ser. No. 08/108,662, filed Aug. 31, 1993, invented by Lin, et al., which is incorporated by reference as if fully set forth herein. This application also describes an architecture allowing segmentation of the header region for erase.

With reference to FIGS. 5 through 8, a page programming architecture for use with the integrated circuit of the present invention is provided for example.

Figure 5:
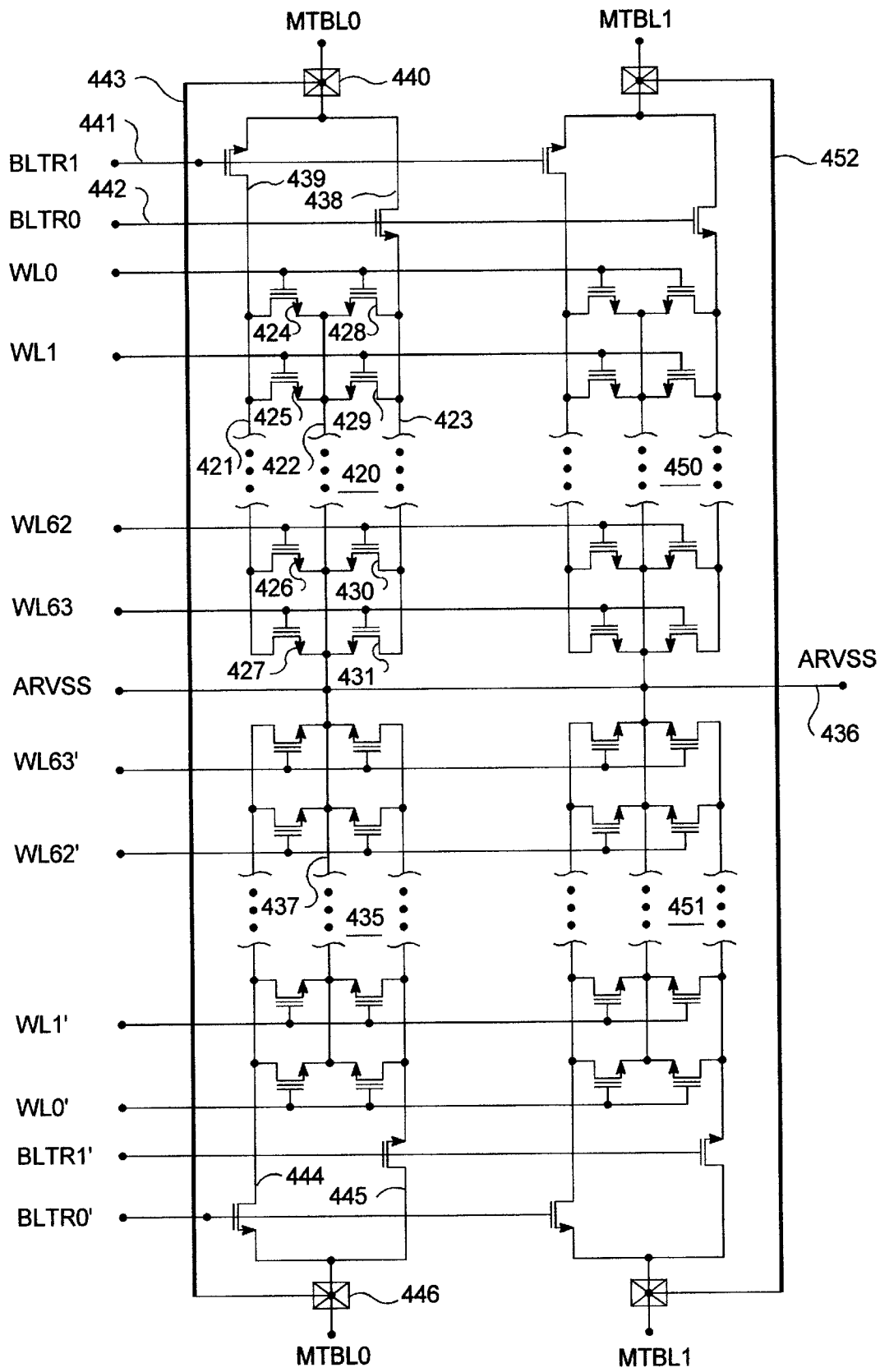
FIG. 5 is a schematic of an array architecture suitable for the page programming process described above according to one embodiment of the present invention.

In FIG. 5, a flash EPROM array architecture is provided. Note that the array includes word lines WL0 through WL63 for each block of the array, and block select transistors BLTR1 and BLTR0 for each block of the array. Using the sector and page number addressing described above, the word lines are decoded according to the sector address, the page number in combination with the sector address decoding is used for the block select transistors BLTR1 and BLTR0, and the columns are decoded according to the page address. With four word lines shared per word line driver, and two pages per row, there are eight pages driven by a single word line address. The selected page is determined by the page number decoded using the block select transistors BLTR1 and BLTR0.

FIG. 5 illustrates an architecture of the flash EEPROM array according to the present invention, in which two columns of flash EEPROM cells share a single metal bit line. FIG. 5 shows four pairs of columns of the array, where each pair of columns includes flash EEPROM cells in a drain-source-drain configuration.

Thus, the first pair 420 of columns includes a first drain diffusion line 421, a source diffusion line 422, and a second drain diffusion line 423. Word lines WL0 through WL63 each overlay the floating gates of a cell in a first one of the pairs of columns and a cell in the second one of the pairs of columns. As shown in the figure, a first pair 420 of columns includes one column including cell 424, cell 425, cell 426, and cell 427. Not shown are cells coupled to word lines WL2 through WL61. The second one of the pair 420 of columns includes cell 428, cell 429, cell 430, and cell 431. Along the same column of the array, a second pair 435 of columns is shown. It has a similar architecture to the pair 420 of columns except that it is laid out in a mirror image.

Thus, as can be seen, the transistor in the first one of the pair of columns, such as the cell 425, includes a drain in drain diffusion line 421, and a source in the source diffusion line 422. A floating gate overlays the channel region between the first drain diffusion line 421 and the source diffusion line 422. The word line WL1 overlays the floating gate of the cell 425 to establish a flash EEPROM cell.

The column pair 420 and column pair 435 share an array virtual ground diffusion 436 (ARVSS). Thus, the source diffusion line 422 of column pair 420 is coupled to the ground diffusion 436. Similarly, the source diffusion line 437 of column pair 435 is coupled to the ground diffusion 436.

As mentioned above, each pair 420 of columns of cells shares a single metal line. Thus, a block right select transistor 438 and a block left select transistor 439 are included. The transistor 439 includes a drain in the drain diffusion line 421, a source coupled to a metal contact 440, and a gate coupled to the control signal BLTR1 on line 441. Similarly, the right select transistor 438 includes a source in the drain diffusion line 423, a drain coupled to the metal contact 440, and a gate coupled to the control signal BLTR0 on line 442. Thus, the select circuitry, including transistors 438 and 439, provides for selective connection of the first drain diffusion line 421 and a second drain diffusion line 423 to the metal line 443 (MTBL0) through metal contact 440. As can be seen, column pair 435 includes left select transistor 444 and right select transistor 445 which are similarly connected to a metal contact 446. Contact 446 is coupled to the same metal line 443 as is contact 440 which is coupled to column pair 420. The metal line can be shared by more than two columns of cells with additional select circuitry.

Although the figure only shows four column pairs 420, 435, 450, and 451, coupled to two metal bit lines 443 and 452 (MTBL0–MTBL1), the array may be repeated horizontally and vertically as required to establish a large scale flash EEPROM memory array. Thus, column pairs 420 and 450 which share a word line are repeated horizontally to provide a segment of the array. Segments are repeated vertically. A group of segments (e.g., eight segments) having respective word lines coupled to a shared word line driver may be considered a sector of the array.

Figure 6:
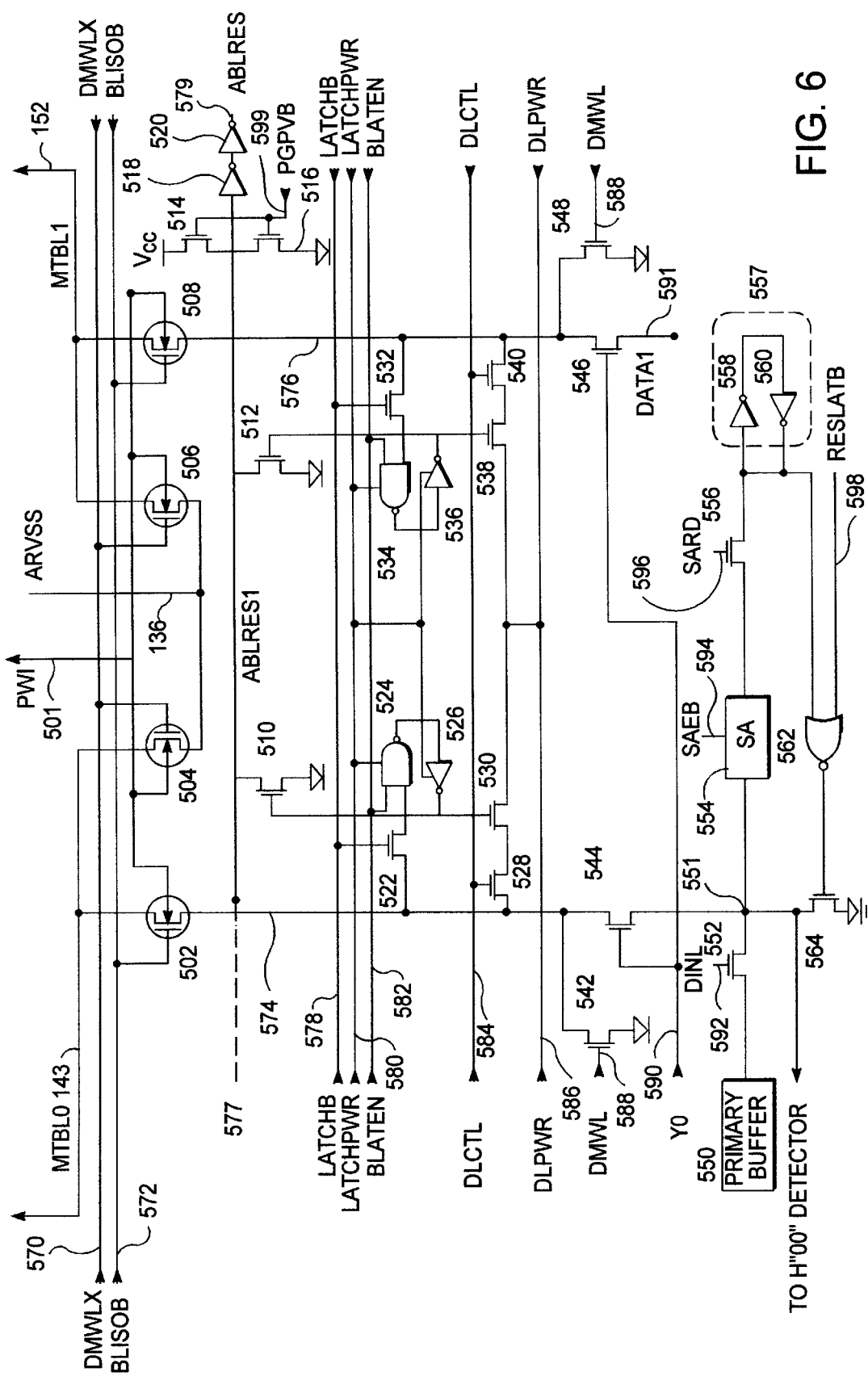
FIG. 6 is a logic diagram of the page buffer and bit latches used for automatic page programming and verify for the architecture of FIG. 5.

FIG. 6 is a schematic diagram of a section of the page program and automatic verify circuitry for two bit lines MTBL0 143 and MTBL1 152. Metal line 143 (MTBL0) of FIG. 6 corresponds to metal line 443 (MTBL0) of FIG. 5. Metal line 152 (MTBL1) corresponds to metal line 452 (MTBL1) of FIG. 5. Array virtual ground 136 (ARVSS) of FIG. 6 corresponds to the array virtual ground 436 (ARVSS) of FIG. 5. The signal PWI on line 501 is coupled to the p-well of transistors 502, 504, 506, and 508. Each pair of bitlines in the array has a similar structure coupled to it.

Referring to FIG. 6, the drain of transistor 502 and the drain of transistor 504 are coupled to the metal line 143 (MTBL0). The drain of transistor 506 and the drain of transistor 508 are coupled to the metal line 152 (MTBL1). The source of transistor of 504 and the source of transistor of 506 are coupled to the array virtual ground 136 (ARVSS). Signal DMWLX on line 570 is coupled to gate of transistor 504 and gate of transistor 506. When signal DMWLX on line 570 is active, the array virtual ground line 136 (ARVSS) is coupled to the metal line 143 (MTBL0) and the metal line 152 (MTBL1) via transistor 504 and transistor 506, respectively.

Data I/O line 574 is coupled to the source of transistor 502. Data I/O line 576 is coupled to the source of transistor 508. Signal BLISOB on line 572 is coupled to the gate transistor 502 and the gate of transistor 508. When signal BLISOB is high, metal line 143 is coupled to data I/O line 574 via transistor 502, and metal line 152 is coupled to data I/O line 576 via transistor 508.

Data I/O line 574 is coupled to the drain of transistor 542. The source of transistor 542 is coupled to ground, and the gate of transistor 542 is coupled to signal DMWL on line 588. The data I/O line 574 is pulled down when the signal DMWL is high.

Data I/O line 574 is further coupled to the drain of column select transistor 544. The source of transistor 544 is coupled to node 551. The gate of transistor 544 is coupled to signal Y0 on line 590.

A primary buffer location 550 is coupled to the source of pass gate 552. The drain of pass gate 552 is coupled to node 551. Pass gate 552 is controlled by signal DINL on line 592.

Sense amp 554 is also coupled to node 551. Sense amp 554 is controlled by signal SAEB on line 594. The output of sense amp 554 is coupled to the drain of pass gate 556. The source of pass gate 556 is coupled to latch circuit 557. Pass gate 556 is controlled by signal SARD on line 596.

Node 551 is also connected to the H"00" detector 120 of FIG. 2.

The latch circuit includes inverters 558 and 560. The input of inverter 558 is coupled to the source of pass gate 556. The output of inverter 558 is coupled to the input of inverter of 560, and the output of inverter 560 is coupled to the source of pass gate 556. The output of latch circuit 557 is also coupled to a first input to NOR gate 562. A second input to NOR gate 562 is coupled to signal RESLATB on line 598. The output of NOR gate 562 is coupled to the gate of transistor 564. The drain of transistor 564 is coupled to node 551, and the source is coupled to ground.

Data I/O line 576 which is coupled through transistor 508 to bit line 152 is connected in a similar manner. Thus, line 576 is coupled to the drain of transistor 548. The source of transistor 548 is coupled to ground, and the gate is coupled to signal DMWL on line 588. The drain of transistor 546 is also coupled to data I/O line 576. Signal Y0 is coupled to the gate of transistor 546. The source of transistor 546 is coupled to node DATA1 591 which corresponds to node 551 for the other side. For simplicity, a corresponding set of primary buffer location 550, sense amp 554, latch circuit 557 and associated circuits coupled to node DATA1 591 are not shown. In operation, circuits similar to DIN buffer 550, pass gate 552, sense amp 554, pass gate 556, latch circuit 557, NOR gate 562, and transistor 564 are similarly configured and coupled to node DATA1 591.

Each data I/O line 574, 576 has a bit latch/verify logic circuit coupled to it, comprised generally of the NAND gate 524 and inverter 526 for data I/O line 574, and of NAND gate 534 and inverter 536 for data line I/O 576. For data I/O line 574, the drain of pass gate 522 is coupled to data I/O line 574, and the source of pass gate 522 is coupled to a first input of NAND gate 524. A second input to NAND gate 524 is coupled to signal BLATEN on line 582. The output of NAND gate 524 is coupled to the input of inverter 526. The input power for NAND gate 524 and inverter 526 is coupled to signal LATCHPWR on line 580. Signal LATCHB on line 578 is coupled to the gate of pass gate 522. The output of inverter 526 is coupled to the first input of NAND gate 524, the gate of transistor 510, and the gate of transistor 530. The drain of transistor 510 is coupled to signal ABLRES1 on line 577. The source of transistor 510 is coupled to ground. The drain of transistor 530 is coupled to signal DLPWR on line 586. The source of transistor 530 is coupled to the drain of transistor 528. The gate of transistor 528 is coupled to signal DLCTL on line 584, and the source of transistor 528 is coupled to data I/O line 574.

The data=1 state latched in latch circuitry 524 and 526 pulls down signal ABLRES1 on line 577. The logic high level enables transistor 510 which causes a logic low level on line 577. When transistor 510 is enabled, line 577 is coupled to ground which causes signal ABLRES1 to a logic low level. Transistors 514 and 516 comprise an inverter, which, together with transistors 510 and 512, provides a NOR logic function. Transistor 514 is a p-channel transistor with the source coupled to Vcc and the drain coupled to the drain of n-channel transistor 516. Line 577 is coupled to the drains of transistors 514 and 516. The source of n-channel transistor 516 is coupled to ground, and the gates of transistors 514 and 516 are coupled to signal PGPVB on line 599. Inverters 518 and 520 are coupled in series. Line 577 provides the input to inverter 518. The output of inverter 518 provides the input of inverter 520, and the output of inverter 520 provides signal ABLRES on line 579. Thus, whenever latch circuitry 524 and 526 stores a logic high level, signal ABLRES is a logic low level. Transistor 514 provides a pull-up to line 577 which can be driven to a logic low level by enabling either transistor 510 or transistor 512. The purpose of transistor 516 is that during default state PGPVB on line 599 is "HIGH", and all the gates of transistors 510, 512 . . . are low, so that if there is no transistor 516, ABLRES1 on line 577 is floating. Transistor 516 is added to help to pull line 577 low in this case. During active mode, which is program-verify period during page program mode, PGPVB on line 599 is active "LOW", transistor 516 is off and transistor 514 provides a pull-up to line 577.

The ABLRES signal on line 579 corresponds to the F.ALL"0" or H.ALL"0" signal on line 113 of FIG. 2. In order to provide one signal for the fault tolerant area and another signal for the header area, as indicated in FIG. 2, the logic needs to be structured so that the header area and fault tolerant area drive independent outputs. Thus, the line ABLRES1 577 of FIG. 6 may correspond to the fault tolerant area. An independent line like ABLRES1 577 and inverter would be used for driving the output for the header area.

A mirrored arrangement of circuits also controlled by signals LATCHB, LATCHPWR, BLATEN and DLCTL and are coupled to data I/O line 576. The drain of pass gate 532 is coupled to data I/O line 576. The gate of pass gate 532 is coupled to signal LATCHB on line 578. The source of pass gate 532 is coupled to a first input to NAND gate 534. A second input to NAND gate 534 is coupled to signal BLATEN on line 582. The output of NAND gate 534 is coupled to the input of inverter 536. Signal LATCHPWR on line 580 provides input power to NAND gate 534 and inverter 536. The output of inverter 536 is coupled to the first input of NAND gate 534, the gate of transistor 512, and the gate of transistor 538. Signal DLPWR on line 586 is coupled to the drain of transistor 538. The source of transistor 538 is coupled to the drain of transistor 540. The gate of transistor 540 is coupled to signal DLCTL on line 584, and the source of transistor 540 is coupled to data I/O line 576. The source of transistor 512 is coupled to ground and the drain of transistor 512 is coupled to line 577.

Figure 7:
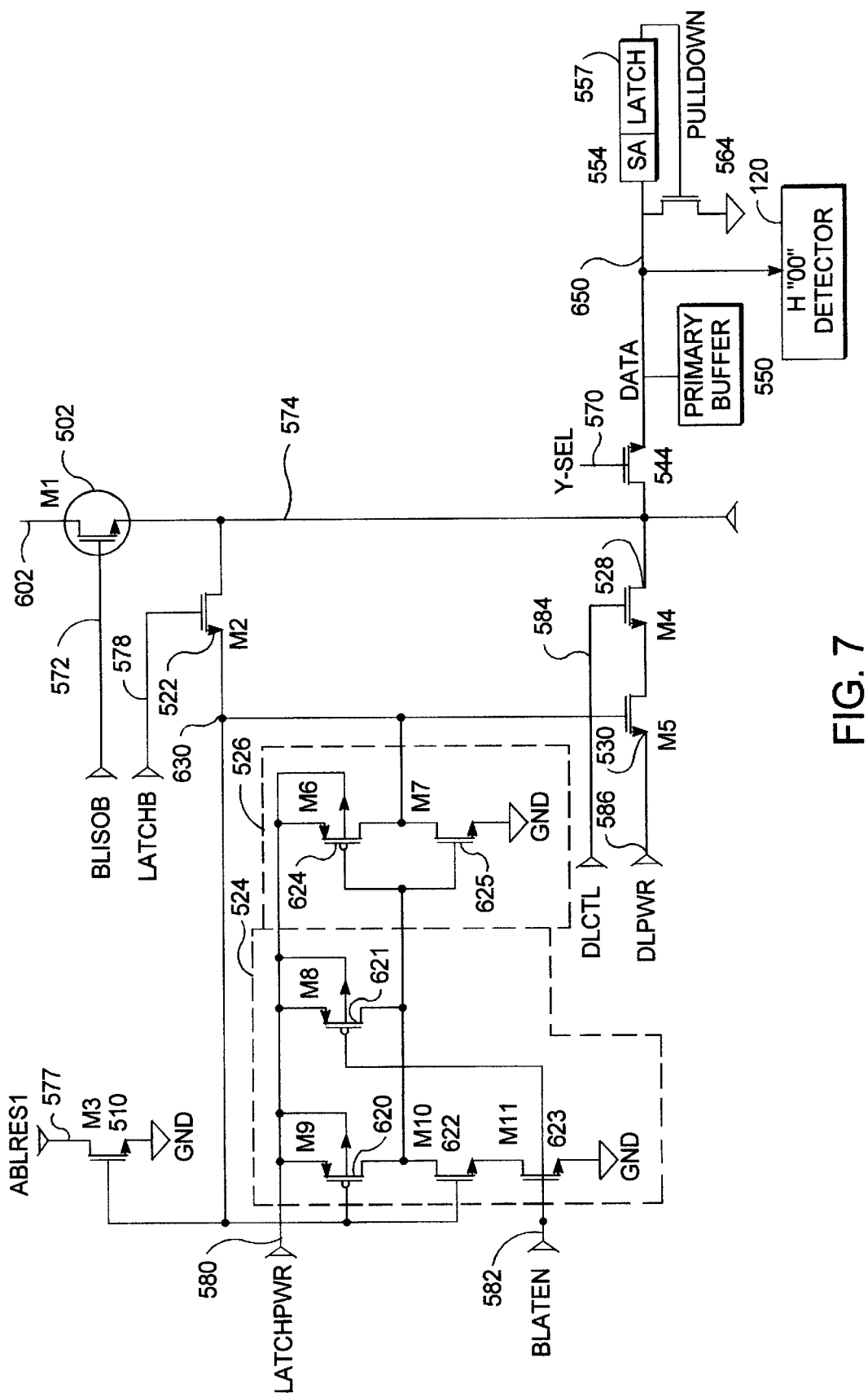
FIG. 7 is a circuit diagram of the page program and automatic verify circuit used in the system of FIG. 6.

FIG. 7 is a circuit diagram of a single bit latch for a bit line 602 in the memory array, such as a line corresponding to the metal line 143 (MTBL0) of FIG. 6. As in FIG. 6, the drain of transistor 502 is coupled to line 602. The source of transistor 502 is coupled to data I/O line 574. The gate of transistor 502 is coupled to signal BLISOB on line 572. The width of transistor 502 is 20 microns, and the length of transistor 502 is 1.2 microns. The drain of transistor 522 is coupled to data I/O line 574, and the source of transistor 522 is coupled to a first input of NAND gate 524. Signal LATCHB on line 578 is coupled to the gate of transistor 522. The width of transistor 522 is 6 microns, and the length of transistor 522 is 1.2 microns.

Transistors 620, 621, 622, and 623 comprise NAND gate 524. Transistor 624 and 625 comprise inverter 526. Signal LATCHPWR on line 580 provides power to NAND gate 524 and inverter 526. For example, the source of p-channel transistor 620, the source of p-channel transistor 621, and the source of p-channel transistor 624 are coupled to signal LATCHPWR on line. The substrates of transistor 620, transistor 621, and transistor 624 are also coupled to LATCHPWR on line 580. The gate of transistor 620 is coupled to node 630 providing the first input of NAND gate 524. The gate of transistor 622 is further coupled to node 630. The drain of transistor 622 and the drain of transistor 621 are coupled to the drain of transistor 620. The gate of transistor 621 and the gate of transistor 623 are coupled to signal BLATEN on line 582. Signal BLATEN on line 582 provides a second input to NAND gate 524. The drain of transistor 623 is coupled to the source of transistor 622, and the source of transistor 623 is coupled to ground.

The drain of transistor 621 provides the output of NAND gate 524 and is coupled to the input of inverter 526. The gate of transistor 624 and the gate of transistor 625 provide the input to inverter 526. The source of transistor 624 is coupled to signal LATCHPWR on line 578 to provide power to inverter 526. The drains of transistor 624 and transistor 625 are coupled to node 630 and provide the output of inverter 526. The source of transistor 625 is coupled to ground. The substrate of transistor 624 is coupled to signal LATCHPWR on line 578.

Transistors 621 and 624 have a width of 3 microns and a length of 1.4 microns. Transistor 620 has a length of 1.6 microns and a width of 3 microns. Transistor 622 and transistor 623 have a width of 3 microns and a length of 1.2 microns. Transistor 625 has a width of 3 microns and a length of 2 microns.

The output of latch circuitry 524 and 526 is coupled to the gate of transistor 530 and the source of transistor 522. Signal DLPWR on line 586 is coupled to the source of transistor 530. The drain of transistor 530 is coupled to the source of transistor 528. The gate of transistor 528 is coupled to signal DLCTL on line 584. The drain of transistor 528 is coupled to data I/O line 574. Transistor 530 and transistor 528 have a width of 6 microns and a length of 1.2 microns.

The drain of transistor 510 provides output signal ABLRES1 on line 577. The source of transistor 510 is coupled to ground, and the gate of transistor 510 is coupled to node 630. Thus, depending on the state of the bit latch, signal ABLRES1 is either shorted to ground or pulled up by transmitter 514. The width of transistor 510 is 3 microns and the length is 0.8 microns.

The drain of transistor 544 is coupled to data I/O line 574, and the source is coupled to data line 650. Signal YSEL on line 570 is coupled to the gate of transistor 544 on line 570. Primary buffer location 550 is coupled to data line 650. Sense amp 554 is coupled to data line 650 and provides through latch 557 a control signal to the gate of transistor 564. Also, the H"00" detector 120 of FIG. 2 is also connected to line 650. The drain of transistor 564 is coupled to data line 650, and the source of transistor 564 is coupled to ground. Thus, depending on the output of sense amp 554, transistor 564 couples data line 650 to ground.

In operation, the page program and automatic verify circuit of the flash EEPROM array as shown in FIGS. 6 and 7 executes the page program and program verify in a series of stages. The stages can be generalized as a (1) data loading stage; (2) data program stage; (3) read the array data stage; (4) reset bit latch stage; and (5) retry stage. The operation of the page program and automatic verify of the flash EEPROM array is described with reference to data I/O line 574. Page program and automatic verify are similarly performed using data I/O line 576 that is coupled to another memory cell. Furthermore, the page program and automatic verify circuit includes similar circuitry for all data I/O lines needed to program a page of memory cells in the flash EEPROM array.

In the data loading stage, signal LATCHPWR on line 580, signal LATCHB on line 578, and signal BLATEN on line 582 are supplied with 5 volts to activate data latch circuitry 524 and 526 for operation. Signal LATCHPWR on line 580 supplies voltage to NAND gate 524 and inverter 526 for operation. Signal BLATEN on line 582 enables latch circuitry 524 and 526 to receive inputs. Signal LATCHB on line 578 enables pass gate 522 to couple data I/O line 574 with the first input of NAND gate 524. Signal BLISOB on line 572 is at a logic low level which disables transistor 502. Disabling transistor 502 isolates data I/O line 574 from the metal line 143 (MTBL0). Signal DLCTL on line 584 is at a logic low level which disables pass gate 528. Signal DLPWR is at a logic high level having a voltage of Vcc that is approximately 5 volts. Signal DMWL on line 588 is at a logic low which prevents transistor 542 from coupling data I/O line 574 to ground. Signal Y0 on line 590 is a logic high level which enables transistor 544 to conduct. Signal Y0 is a decoded signal which enables data I/O line 574 to access a corresponding one of 16 DIN buffers (e.g. buffer 550) during the data loading stage. Signal DINL on line 592 is a logic high which enable pass gate 552. Input data from DIN buffers 550 is transferred via pass gate 552 to data I/O line 574.

Once input data is transferred to data I/O line 574, the data from DIN buffer 550 is transferred to the first input of NAND gate 524. If data from DIN buffer 550 is a logic high level, the logic high level received at the first input of NAND gate 524 causes a logic low output. The logic low output of NAND gate 524 provides the input to inverter 526 which provides a logic high output. NAND gate 524 and inverter 526 comprise the bit latch circuitry 524 and 526 which latches the data received at the first input of NAND gate 524. The logic high level at the output of inverter 526 enables pass gate 530 and transfers signal DLPWR on line 586 to pass gate 528. However, during the data loading stage, signal DLCTL on line 584 is a logic low which disables pass gate 528 from conducting signal DLPWR to data I/O line 574.

In the other case, when data from DIN buffer 550 is a logic low level, the logic low level received at the first input of NAND gate 524 causes a logic high output. The logic high output of NAND gate 524 provides the input to inverter 526 which provides a logic low output that is stored in latch circuitry 524 and 526. The logic low at the output of inverter 526 disables pass gate 530 and the transfer of signal DLPWR on line 586 via pass gate 528 to data I/O line 574. Thus, the bit latch circuit of NAND gate 524 and inverter 526 stores either the logic high level or the logic low level of the input data which corresponds to the data transferred from DIN buffer 550.

The bit latches for the entire page of 1024 bits are loaded 16 bits at a time. Once the input data from DIN buffers 550 is loaded into bit latch circuitry 524 and 526 after execution of the data loading stage for all bit lines, a verify sequence is executed followed by the data write stage. The pre-writing verify loop (according to the sequence described below) prevents over programming cells into depletion such as if a user programs the page with the same data twice. A data write occurs when a logic high is stored in the latch circuitry 524 and 526. When a logic high level data=1 state is received from DIN buffer 550, the logic high level is programmed to a cell of the flash EEPROM array during the data write stage. If a logic low level (data=0) is received from DIN buffer 550 and stored in latch circuitry 524 and 526, the data write stage does not program the memory cell of the flash EEPROM.

In the present example, a logic high level (data=1) is transferred from DIN buffer 550 and stored in bit latch circuitry 524 and 526. During the execution of the data write stage, signal LATCHB on line 578 is disabled. Signal LATCHB on line 578 is set to a logic low to disable inputs to latch circuitry 524 and 526. Signal LATCHPWR is set to a high voltage to provide power to latch circuitry 524 and 526. Signal BLATEN on line 582 is set to a high voltage to enable the output of latch circuitry 524 and 526. Signal BLISOB on line 572 is set to a high voltage level to enable transistor 502. Transistor 502 couples data I/O line 574 to metal line 143. Signal DLCTL on line 584 is set to a high voltage level to enable pass gate 528. Signal DLPWR on line 586 is set to a high voltage. Signal Y0 on line 590 is a logic low level to disable transistor 544. Signal DINL is a logic low level which decouples input data from DIN buffer 550 from data I/O line 574. Signal SAEB is a logic low level to disable sense amp 554.

Once the control signals are properly initialized to perform the data program stage, signal DLPWR on line 586 is transferred to data I/O line 574. Signal DLPWR provides programming power to program a memory cell in the flash EEPROM array. Thus, if latch circuitry 524 and 526 is latched with a data=1 state, pass gate 530 is enabled to permit signal DLPWR to pass through pass gate 528. Signal BLISOB on line 572 enables transistor 502 and couples signal DLPWR to the metal line 143 (MTBL0).

Referring to FIG. 5, enabling signal BLTR1 on line 441 or BLTR0 on line 442 couples a column of cells to the metal line 443 and provides the programming voltage from signal DLPWR to program a particular memory cell 425 or 429 on the word line which is changed to −8 volts. For instance, if BLTR1 on line 441 is selected and word line WL1 is selected, the programming voltage from signal DLPWR is directed to memory cell 425.

After the data from latch circuitry 524 and 526 is programmed to the memory cell, the circuitry is ready to verify automatically that the data was properly programmed in the data write stage. This involves a five step sequence (A through E; see FIG. 8 for timing diagram) for deciding whether to reset the bit latch as follows:

Step A

READ the real data from the non-volatile bit through the associated sense amp (all 16 sense amps are activated at the same time, i.e. 16 bits are read at the same time). The sensing result is stored in latch 557 of FIG. 6. For example, in FIG. 6, to verify a selected cell from a specified wordline, BLISOB (572) must be high (ON), selected Y (544, 546 and 14 more of such devices) is on, sense amp (SA) 554 is activated (and 15 other SA), SARD (596) is high to allow the sensing result pass to the latch (557) and LATCHB (578), DLCTL (584) are at low voltage (OFF) so that during this READ step, the bit latch consisting of 524 and 526 will not be disturbed. The selected cell threshold voltage is sensed by the SA (554) via data line 574 and then stored in latch 557, after a certain amount of time which is long enough for the SA (554) to do the sensing. If after programming, the cell's threshold voltage (VT) is low enough (to the point that the SA 554 can tell that the cell is at low VT state) then the output of the inverter (560, or input of 558) will reflect a low level, SARD (596) is off and then SA (544) is disabled. The low level is stored in latch (557), no matter what read happens during the next 4 steps in sequence until the new locations need to be read again. If after programming, the selected cell VT is still read high, then the output of inverter 560 is at high level, i.e. a logic high level is latched in latch 557. Note that RESLATB (598) is HIGH in this step so that whether latch 557 latched high or low will not affect device (564) because device 564 is OFF anyway.

Step B

Figure 8:
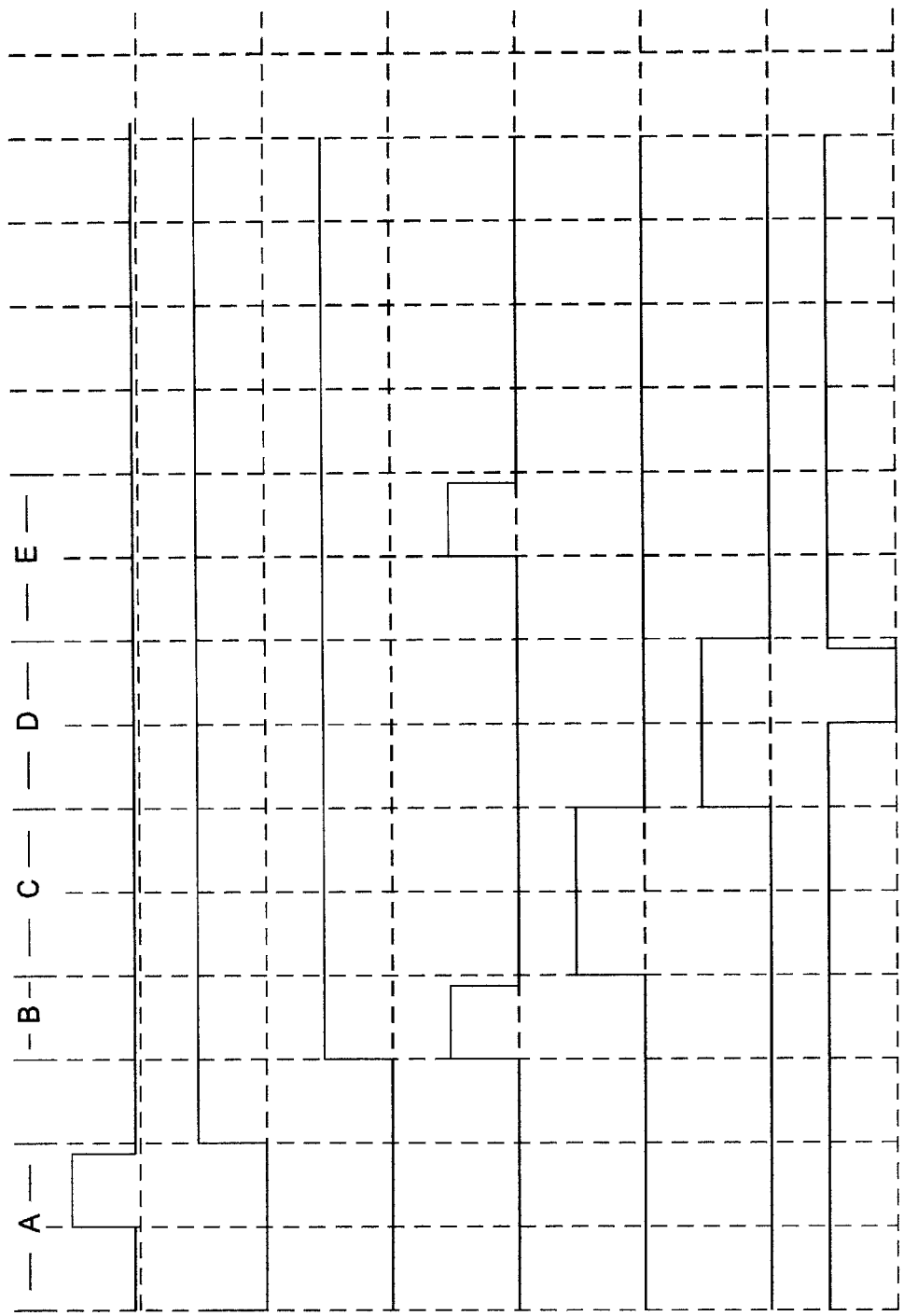
FIG. 8 is a timing diagram for control signals in the automatic verify circuitry of FIGS. 6 and 7.

DISCHARGE DATA LINES (all including selected and deselected) The purpose of this step will be explained in STEP D). The way of discharging the data line 574 is by activating DMWL (588) to high, LATCHB at low, DLCTL at low, with all sense amps disabled, 564 and 552 are off. Transistor 542 discharges charge stored in data line 574. BLISOB (572) is at low level (BLISO of FIG. 8 is high) to isolate the long metal-bit-line (MTBL0) from the data line (574) so that the discharge sequence can be achieved faster.

Step C

PRE-CHARGE DATA LINES (selectively, according to the associated bit latch) The purpose of this step will be explained in step D.) During this step, DMWL is at low level, BLISOB is still at low level (BLISO of FIG. 8 is high), whether the selected 16 data lines of the same word and other de-selected data lines should be precharged to a high voltage level or not is decided by the data which is stored in the bit latch. For example, in FIG. 6, during this step LATCHB (578) is still off, DLCTL (584) is switched from low to high, and data line 574 is precharged to a high level by connecting DLPWR (a $V_{cc}$ level power source for this instance) to the data line (574) via devices 530 and 528 if the output of inverter 526 (which is the gate of 530) is latched at HIGH level. Otherwise DLPWR cannot precharge data line 574 to a high level and the data line 574 should be still at a low voltage level due to step B)

Step D

RESET BIT LATCH OR NOT? During this step LATCHB (578) is switched from low level to a high level, and RESLATB (598) switches from high to low in order to reset bit latch (which consists of NAND gate 524 and inverter 526 by turning on 564, if the output of inverter 560 is (latched) low (from step A). Since the selected cell is at low VT already, the bit latch content shall be reset so that for the next programming, high voltage pulse sequence, the cell which is at low VT shall not be programmed to low VT again. There is a chance that the bit latch had been reset from a previous verify loop step D) or was at reset state even before the first programming sequence. In these cases, the subsequent reset bit latch step is of no effect to the bit latch for the former case; and for the latter case whether the selected cell is at high VT or not will not affect the bit latch because that if the cell is at high VT, there is no resetting the bit latch (564 is OFF, from Steps A and D) and bit latch was at reset state. If the cell was at low VT, then resetting the bit latch again makes no difference to the contents of the bit latch. There is no comparison circuit needed in this implementation.

Note that LATCHB is a global signal to all the bit latches in the FLASH EEPROM design and the high level at the gates of 522, 532 . . . results in all bit latches talking to the associated data lines which means that the node of the output of inverter 526 will encounter a charge sharing with the associated data line (574, for example). The driving capability of inverter 526 is designed to be a weak device in order that a proper data can be set (to fight against inverter 526) into the bit latch. So when LATCHB (528) is HIGH, weak inverter (526) suffers a charge sharing issues which results in the uncertainty of the integrity of the bit latch.

The purpose of steps B) and C) is to put the proper voltage level at the data lines before getting into step D), i.e. before LATCHB (578) switches from low to high to avoid any "charge sharing issues", even though the circuitry can be designed as mentioned above to ensure proper operation without them. During step B), all data lines are discharged to low level and then at step C) only those data lines whose associated bit latches "stored" high level will be precharged to a high level. Thus steps B) and C) are optional steps inserted here for safety in the design.

Step E

DISCHARGE ALL DATA LINES AGAIN. At this moment, the program-verify activity is pretty much done, before moving into the next word for programming-verifying (or more precisely, to change the new word and repeat from step A) to step D)), the logic control will remove residue charges from all the data lines and switch to new word. For example, during this step, LATCHB (578) is at LOW level, RESLATB (598) is at HIGH level, DMWL (588) is at HIGH level and BLISOB (572) is at HIGH level (BLISO of FIG. 8 is low).

Thus, the page program and automatic verify circuit of FIG. 6 provides the unique feature of automatically verifying a memory cell that is programmed. Latch circuitry 524 and 526 stores the input data received from DIN buffer 550. The stored data in latch circuitry 524 and 526 controls ABLRES1 which is set to a logic low level if one or more than one of the cells need to be programmed. Signal ABLRES1 remains a logic low level until the memory cell is verified during the program verify sequence which resets latch circuitry 524 and 526 to a logic low level and resets signal ABLRES1 to a logic high level indicating a properly programmed memory cell. The program verify sequence is automatic.

Signal PGPVB on line 599 is a logic low level to supply a charge to line 577 during automatic verify sequence. When latch circuitry 526 and 524 is reset, transistor 510 is disabled and the charge on line 577 is no longer discharged to ground. Signal ABLRES1 on line 577 becomes a logic high level. The logic high level provides an input to inverter 518 which produces an output that provides an input to inverter 520 which provides the logic high level output of signal ABLRES on line 579. The logic high level of signal ABLRES on line 579 provides a page programmed verify signal signifying the page of memory cells has passed program verify.

Each memory cell within a page of memory cells in the array is able to activate a transistor 510 to cause signal ABLRES1 on line 577 to a low level. Thus, any memory cell that does not pass program verify within a page of memory cells in the array can cause the output ABLRES to be a logic low level. The logic low level of ABLRES on line 579 signals that at least one memory cell within the page of memory cells in the array is not properly programmed and verified. Thus, any memory cell not properly verified can cause signal ABLRES on line 579 to be a logic low level. When all memory cells are properly programmed and verified, signal ABLRES on line 579 is a logic high level.

Accordingly, the present invention provides a flash memory integrated circuit architecture which includes a status register for detection of program and erase cycle completion, erase suspend status, program and erase abort status, automatic program and erase error reports, and sector protection status. Further, four extra bytes on each page are provided for user page management. There is defect management circuitry on chip utilizing the statistics registers. Further, dual buffers are provided for buffer write while the chip is busy programming earlier received data. The device is particularly suited to real time data applications, using the simple three line bus architecture with a serial input line, a serial output line and a clock.

Accordingly, the present invention provides a flash memory architecture adapted for real time data storage applications where the data is fault tolerant. This is particularly suited to audio storage and the like, where large non-volatile memory arrays are necessary.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A non-volatile memory device, comprising:
   an integrated circuit;
   an array of floating gate memory cells on the integrated circuit;
   read, erase, program and verify control logic for the array on the integrated circuit; and
   a status register on the integrated circuit, coupled with the control logic, to store defect statistics for a program operation in which a plurality of bytes is programmed to the array, and the defect statistics characterize defects determined during verify operations concerning the plurality of bytes, and logic coupled with the status register which overwrites the defect statistics of a previous program operation.

2. The memory device of claim 1, wherein the control logic includes erase verify resources, and the stored defect statistics indicate a number of defects.

3. The memory device of claim 1, wherein the control logic includes program verify resources, and the stored defect statistics indicate a number of defects.

4. The memory device of claim 1, wherein the control logic includes program verify resources, and the stored defect statistics indicate whether a threshold number of sequential bytes fail program verify.

5. The memory device of claim 1, wherein the control logic includes circuitry which retries program operations for bits in the plurality of bytes which fail program verify, until a maximum retry count is reached.

6. The memory device of claim 1, including a first buffer which receives input data, and a second buffer coupled to the first buffer and to the array, and wherein the control logic executes a program operation which transfers data from the first buffer to the second buffer, and programs data in the second buffer to the array in parallel.

7. The memory device of claim 1, wherein the stored defect statistics include an address of a byte which fails verify.

8. The memory device of claim 1, wherein the control logic includes erase verify resources, and the stored defect statistics indicate a number of bytes including bits stored in memory cells which fail erase verify.

9. The memory device of claim 8, wherein the stored defect statistics include an address of a byte which fails erase verify.

10. The memory device of claim 1, wherein the control logic includes program verify resources, and the stored defect statistics indicate a number of bytes including bits in the plurality of bytes which fail program verify.

11. The memory device of claim 10, wherein the stored defect statistics includes an address of a byte including a bit in the plurality of bytes which fails program verify.

12. The memory of claim 1, wherein the status register comprises a static random access memory.

13. The memory of claim 1, wherein the status register includes a first field which stores information concerning memory configuration including an indication whether a defect was detected in a preceding erase or program verify operation, and a second field which stores a count of defects detected in the preceding erase or program verify operation.

14. The memory of claim 13, wherein the status register includes a third field which stores an address of a byte including a bit in the plurality of bytes which fails verify.

15. The memory device of claim 1, including logic responsive to a command to clear at least a portion of the defect statistics in the status register.

16. A non-volatile memory device, comprising:
    an integrated circuit;
    an array of floating gate memory cells on the integrated circuit, and the array including a first section and a second section; and
    read, erase, program and verify control logic for the array on the integrated circuit, and the control logic including circuitry which retries a program operation in which a plurality of bytes is programmed to the array for bits in the plurality of bytes programmed to the first section of the array which fail program verify until a first maximum retry count is reached, and which retries program operations for bits in a plurality of bytes programmed to the second section of the array which fail program verify until a second maximum retry count is reached, and the first maximum retry count being greater than the second maximum retry count.

17. The memory device of claim 16, wherein the first section stores header information concerning data in the second section.

18. The memory device of claim 16, including a first buffer which receives input data, and a second buffer coupled to the first buffer and to the array, and wherein the control logic executes a program operation which transfers data from the first buffer to the second buffer, and programs data in the second buffer to the array in parallel.

19. A non-volatile memory device for fault tolerant data storage, comprising:
    an array of floating gate memory cells;
    a data input, which receives an input data stream;
    a buffer memory, coupled to the input, which receives data from the data input and applies the received data to the array for programming;
    erase, program and verify control logic, coupled to the buffer memory, including resources for programming the array with data from the buffer memory, and for erasing at least portions of the array;
    a volatile status register, coupled with the control logic, to store defect statistics characterizing defects determined during verify operations concerning at least one of programming and erasing operations; and
    read control logic, coupled to the array and to the status register, providing read access to the array and to the status register.

20. The memory device of claim 19, wherein the stored defect statistics indicate a number of defects detected in an operation involving a plurality of bytes of data.

21. The memory device of claim 19, wherein the stored defect statistics indicate whether a threshold number of sequential bytes include bits in a plurality of bytes programmed to the array which fail program verify.

22. The memory device of claim 19, wherein the control logic includes circuitry which retries programming operations for bits in a plurality of bytes programmed to the array which fail program verify, until a maximum retry count is reached, and if the maximum retry count is reached for a particular byte, then logs a program defect to the status register.

23. The memory device of claim 19, wherein the buffer memory includes a first buffer which receives input data from the data input, and a second buffer coupled to the first buffer and to the array, and wherein the control logic executes a program operation which transfers data from the first buffer to the second buffer, and programs data in the second buffer to the array in parallel.

24. The memory device of claim 19, wherein the stored defect statistics include an address of a byte which fails verify.

25. The memory device of claim 19, wherein the control logic includes erase verify resources, and the stored defect statistics indicate a number of bytes including bits stored in memory cells which fail erase verify for an erased sector of the array.

26. The memory device of claim 25, wherein the stored defect statistics include an address of a byte which fails erase verify.

27. The memory device of claim 19, wherein the control logic includes program verify resources, and the stored defect statistics indicate a number of bytes including bits programmed to memory cells which fail program verify for a program operation involving a plurality of bytes of data.

28. The memory device of claim 27, wherein the stored defect statistics include an address of a byte including a bit programmed to a memory cell which fails program verify.

29. The memory device of claim 19, wherein the status register comprises a static random access memory.

30. The memory device of claim 19, wherein the status register includes a first field which stores information concerning memory configuration including an indication whether a defect was detected in a preceding erase or program verify operation involving a plurality of bytes of data, and a second field which stores a count of defects detected in the preceding erase or program verify operation.

31. The memory device of claim 30, wherein the status register includes a third field which stores an address of a byte including a bit programmed to a memory cell which fails verify.

32. A non-volatile memory device for fault tolerant data storage, comprising:

an array of floating gate memory cells and the array including a first section and a second section;

a data input, which receives an input data stream;

a buffer memory, coupled to the input, which receives data from the data input and applies the received data to the array for programming;

erase, program and verify control logic, coupled to the buffer memory, including resources for programming the array with data from the buffer memory, and for erasing at least portions of the array, and the control logic including circuitry which retries program operations for bits in a particular byte programmed to the first section of the array which fail program verify until a first maximum retry count is reached and if the first maximum retry count is reached for the particular byte, then signals program failure, and which retries program operations for bits in a particular byte programmed to the second section of the array which fail program verify until a second maximum retry count is reached and if the second maximum retry count is reached for the particular byte, then logs a defect, and the first maximum retry count being greater than the second maximum retry count; and read control logic, coupled to the array and to the status register, providing read access to the array.

33. The memory device of claim 32, wherein the first section stores header information concerning data in the second section.

34. A non-volatile memory device for real-time, fault tolerant data storage, comprising:

an array of non-volatile, floating gate memory cells;

a data input which receives input data;

a page program buffer, coupled to the data input, which receives the input data and applies a page of input data in parallel to the array for programming, the page including more than 32 bits;

erase, program and verify control logic, coupled to the page program buffer, including resources for programming the array with data from the page program buffer, and including resources for erasing selected segments of data in the array;

a status register comprising volatile storage cells, coupled with the erase, program and verify control logic, to store defect statistics characterizing defects determined during verify operations; and read control logic, coupled to the array and to the status register, providing read access to the array and to the status register.

35. The memory device of claim 34, wherein the stored defect statistics indicate a number of defects.

36. The memory device of claim 34, wherein the control logic includes circuitry which retries page program operations for bits in a particular byte programmed to the array which fail program verify, until a maximum retry count is reached, and if the maximum retry count is reached for the particular byte, then logs a program defect to the status register.

37. The memory device of claim 34, wherein the page program buffer includes a first buffer which receives input data, and a second buffer coupled to the first buffer and to the array, and wherein the control logic executes a program operation which transfers data from the first buffer to the second buffer, and programs data in the second buffer to the array in parallel.

38. The memory device of claim 34, wherein the stored defect statistics indicate a whether a threshold number of sequential bytes fail program verify.

39. The memory device of claim 34, wherein the stored defect statistics include an address of a byte which fails verify.

40. The memory device of claim 34, wherein the control logic includes erase verify resources, and the stored defect statistics indicate a number of bytes including bits stored in memory cells which fail erase verify.

41. The memory device of claim 40, wherein the stored defect statistics include an address of a byte which fails erase verify.

42. The memory device of claim 34, wherein the control logic includes program verify resources, and the stored defect statistics indicate a number of bytes including bits programmed to memory cells which fail program verify.

43. The memory device of claim 42, wherein the stored defect statistics include an address of a byte including a bit programmed to a memory cell which fails program verify.

44. The memory device of claim 34, wherein the status register comprises a static random access memory.

45. The memory device of claim 34, wherein the status register includes a first field which stores information concerning memory configuration including an indication whether a defect was detected in a preceding erase or program verify operation, and a second field which stores a count of defects detected in the preceding erase or program verify operation.

46. The memory device of claim 45, wherein the status register includes a third field which stores an address of a byte including one of a bit stored in a memory cell and a bit programmed to a memory cell which fails verify.

47. A non-volatile memory device for real-time, fault tolerant data storage, comprising:

an array of non-volatile, floating gate memory cells, and the array including a first section and a second section;

a data input which receives input data;

a page program buffer, coupled to the data input, which receives the input data and applies a page of input data in parallel to the array for programming, the page including more than 32 bits;

erase, program and verify control logic, coupled to the page program buffer, including resources for programming the array with data from the page program buffer, and including resources for erasing selected segments of data in the array; and read control logic coupled to the array, and the control logic providing read access to the array, and the control logic including circuitry which retries page programming operations for bits in a particular byte programmed to the first section of the array which fail program verify until a first maximum retry count is reached and if the first maximum retry count is reached for the particular byte programmed to the first section of the array, then signals program failure, and which retries page programming operations for bits in a particular byte programmed to the second section of the array which fail program verify until a second maximum retry count is reached and if the second maximum retry count is reached for the particular byte programmed to the second section of the array, then logs a program defect; and the first maximum retry count being greater than the second maximum retry count.

48. The memory device of claim 47, wherein the first section stores header information concerning data in the second segment.

49. The memory device of claim 47, wherein the first and second maximum retry counts are equal.

50. A method for storing data on an integrated circuit having an array of floating gate memory cells, comprising:

programming a segment of data to the array, the segment including a plurality of bytes of data;

executing a verify operation for the segment;

determining during the verify operation defect statistics characterizing defects in the programmed segment;

storing the defect statistics on the integrated circuit;

reading the defect statistics from the integrated circuit after the program operation; and clearing the defect statistics from the integrated circuit.

51. The method of claim 50, wherein the verify operation includes retrying the programming of data within the segment a maximum number of retries, and if the maximum number of retries is reached, then logging a defect in the statistics.

52. The method of claim 50, wherein the step of storing the defect statistics includes providing a first field which stores information concerning memory configuration including an indication whether a defect was detected in a preceding program verify operation, and a second field which stores a count of defects detected in the preceding program verify operation, and the step of reading includes reading the first field to determine whether a defect was detected, and reading the second field if a defect was detected.

53. The method of claim 52, including providing a third field which stores an address of a byte including a bit programmed to a memory cell which fails verify, and including reprogramming the byte indicated in another location.

54. The method of claim 50, wherein the step of programming includes programming a page of data in parallel, a page including more than four bytes.

55. The method of claim 50, wherein the step of storing defect statistics includes providing a first field which stores a count of defects detected in the preceding program verify operation, and a second field which stores an address of a byte including one of a bit stored in a memory cell and a bit programmed to a memory cell which fails verify, and wherein the step of reading includes reading the first field to determine whether a defect was detected, and reading the second field if defect was detected.

56. A non-volatile memory device, comprising:

an array of floating gate memory cells;

read, erase, program and verify control logic for the array, including program verify resources; and a status register, coupled with the control logic, to store defect statistics which characterize defects determined during verify operations concerning a program operation in which a plurality of bytes were programmed to the array, including defect statistics indicating whether a threshold number of sequential bytes fail program verify, and logic coupled with the status register which overwrites the defect statistics of a previous program operation.

57. The memory device of claim 56, wherein the control logic includes circuitry which retries program operations for bits in the plurality of bytes which fail program verify, until a maximum retry count is reached.

58. The memory device of claim 56, including a first buffer which receives input data, and a second buffer coupled to the first buffer and to the array, and wherein the control logic executes a program operation which transfers data from the first buffer to the second buffer, and programs data in the second buffer to the array in parallel.

59. The memory device of claim 56, wherein the stored defect statistics include an address of a byte which fails verify.

60. The memory device of claim 56, wherein the control logic includes erase verify resources, and the stored defect statistics indicate a number of bytes including bits stored in memory cells which fail erase verify.

61. The memory device of claim 60, wherein the stored defect statistics include an address of a byte which fails erase verify.

62. The memory device of claim 56, wherein the control logic includes program verify resources, and the stored defect statistics indicate a number of bytes including bits programmed to memory cells which fail program verify.

63. The memory device of claim 62, wherein the stored defect statistics include an address of a byte including a bit programmed to a memory cell which fails program verify.

64. The memory of claim 56, wherein the status register comprises a static random access memory.

65. The memory of claim 56, wherein the status register includes a first field which stores information concerning memory configuration including an indication whether a defect was detected in a preceding erase or program verify operation, and a second field which stores a count of defects detected in the preceding erase or program verify operation.

66. The memory of claim 65, wherein the status register includes a third field which stores an address of a byte including one of a bit programmed to a memory cell and a bit stored in a memory cell which fails verify.

67. A non-volatile memory device, comprising:

an array of floating gate memory cells, and the array including a first section and a second section; and read, erase, program and verify control logic for the array, including program verify resources, and the control logic including circuitry which retries program operations for bits in a byte programmed to the first section of the array which fail program verify until a first maximum retry count is reached, and which retries program operations for bits in a byte programmed to the second section of the array which fail program verify until a second maximum retry count is reached, and the first maximum retry count being greater than the second maximum retry count.

68. The memory device of claim 67, wherein the first section stores header information concerning data in the second section.

69. The memory device of claim 67, including a first buffer which receives input data, and a second buffer coupled to the first buffer and to the array, and wherein the control logic executes a program operation which transfers data from the first buffer to the second buffer, and programs data in the second buffer to the array in parallel.

70. A method for storing data on an integrated circuit having an array of floating gate memory cells, comprising:

programming a segment of data to the array, the segment including a plurality of bytes of data;

executing a verify operation for the segment;

determining during the verify operation defect statistics characterizing defects in the programmed segment;

storing the defect statistics on the integrated circuit;

reading the defect statistics from the integrated circuit after the program operation; and overwriting the defect statistics on the integrated circuit.

71. The method of claim 70, including storing an address of a byte including a bit programmed to a memory cell which fails verify, and including reprogramming the byte indicated in another location.

72. The method of claim 70, wherein the step of storing the defect statistics includes providing a first field which stores information including an indication whether a defect was detected in the verify operation, and a second field which stores a count of defects detected in the verify operation, and the step of reading includes reading the first field to determine whether a defect was detected, and reading the second field if a defect was detected.

73. The method of claim 72, including providing a third field which stores an address of a byte including a bit programmed to a memory cell which fails verify, and including reprogramming the byte indicated in another location.

74. The method of claim 70, wherein the step of programming includes programming a page of data in parallel, a page including more than four bytes.

75. The method of claim 70, wherein the step of storing defect statistics includes providing a first field which stores a count of defects detected in the verify operation, and a second field which stores an address of a byte including one of a bit stored in a memory cell and a bit programmed to a memory cell which fails verify, and wherein the step of reading includes reading the first field to determine whether a defect was detected, and reading the second field if defect was detected.

76. The memory device of claim 56, including logic responsive to a command to clear at least a portion of the defect statistics in the status register.

\* \* \* \* \*